(12) United States Patent
Nomoto et al.

(10) Patent No.: US 6,525,379 B2
(45) Date of Patent: Feb. 25, 2003

(54) MEMORY DEVICE, METHOD OF MANUFACTURING THE SAME, AND INTEGRATED CIRCUIT

(75) Inventors: Kazumasa Nomoto, Kanagawa (JP); Noriyuki Kawashima, Kanagawa (JP); Ichiro Fujiwara, Kanagawa (JP); Kenichi Taira, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/919,571

(22) Filed: Jul. 31, 2001

(65) Prior Publication Data

US 2002/0089012 A1 Jul. 11, 2002

(30) Foreign Application Priority Data

Aug. 1, 2000 (JP) ........................................ 2000-233321

(51) Int. Cl.[7] .......................... H01L 21/00; H01L 21/84
(52) U.S. Cl. ....................... 257/347; 257/365; 257/30; 257/37; 438/158
(58) Field of Search ............................ 257/30, 37, 327, 257/347, 365; 438/151–166

(56) References Cited

U.S. PATENT DOCUMENTS

| 5,273,919 | A | * | 12/1993 | Sano et al. ............ 148/DIG. 1 |
| 6,017,794 | A | * | 1/2000 | Burns et al. |
| 2002/0017681 | A1 | * | 2/2002 | Inoue et al. ................. 257/315 |
| 2002/0070406 | A1 | * | 6/2002 | Yamazaki et al. ........... 257/314 |
| 2002/0113268 | A1 | * | 8/2002 | Koyama et al. ............. 257/359 |

\* cited by examiner

*Primary Examiner*—Richard Booth
(74) *Attorney, Agent, or Firm*—Sonnenschein, Nath & Rosenthal

(57) ABSTRACT

Provided are a memory device capable of accurately reading out data, a method of manufacturing the same, and an integrated circuit. A first control electrode substantially faces a second control electrode with a conduction region and a storage region in between. At the time of "the reading of data", an electric potential is applied to the first control electrode. During "the reading of data", a change in an electric potential between the conduction region and the storage region is prevented, and therefore, unintentional writing or erasing of information is prevented, so that written information can be accurately read out.

21 Claims, 29 Drawing Sheets

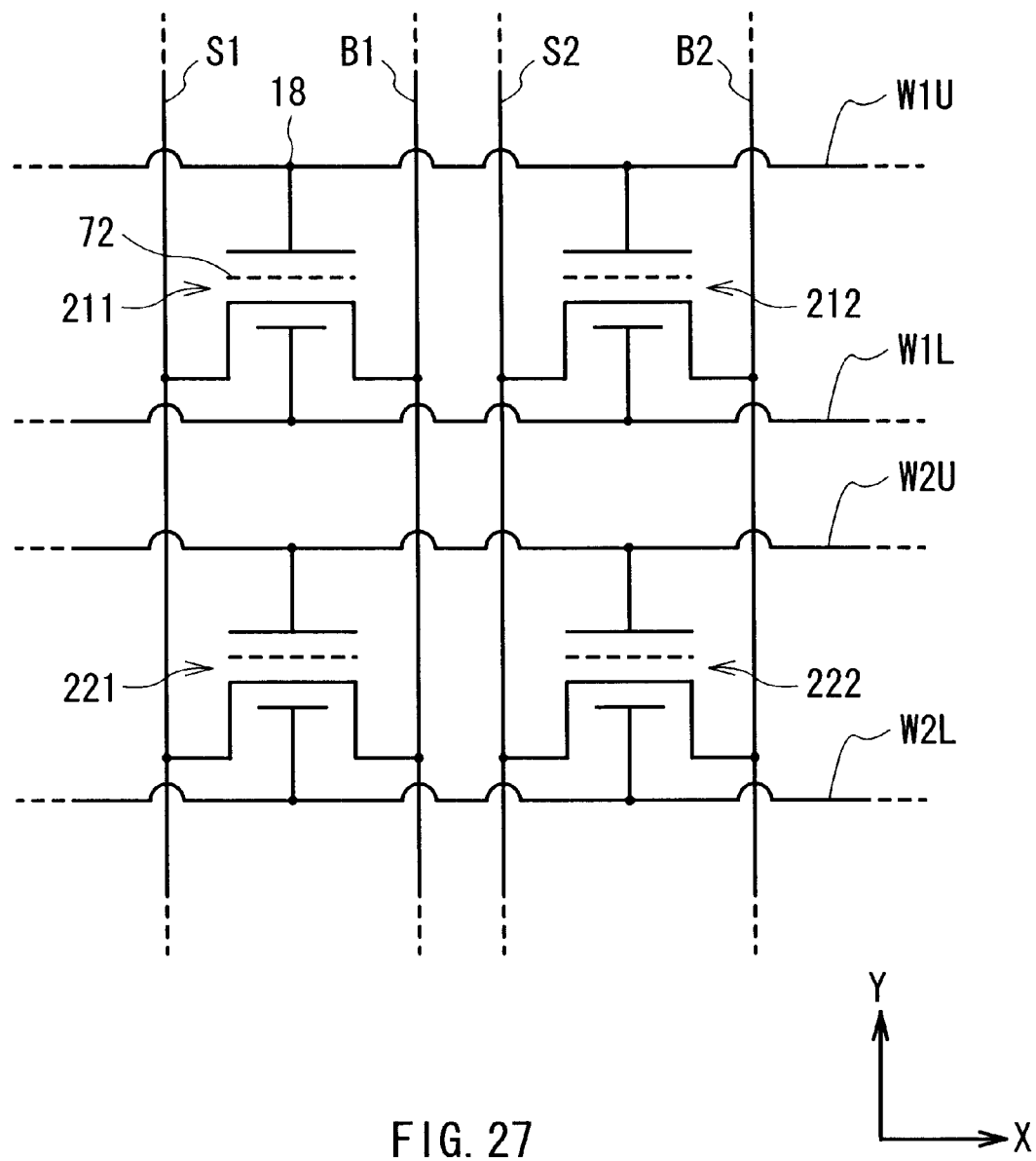
F I G. 27

MEMORY DEVICE, METHOD OF MANUFACTURING THE SAME, AND INTEGRATED CIRCUIT

RELATED APPLICATION DATA

The present application claims priority to Japanese Application No. P2000-233321 filed Aug. 1, 2000, which application is incorporated herein by reference to the extent permitted by law.

BACKGROUND OF THE INVENTION

1. Field of the Invention

The invention relates to a memory device for holding data by storing in a storage region an electric charge transferred from a conduction region, a method of manufacturing the same, and an integrated circuit on which the memory devices are integrated.

2. Description of the Related Art

Conventional memory devices, typified by an EEPROM (electric erasable-programmable read only memory), a flash memory and the like, comprise one gate electrode; a source region, a conduction region and a drain region, which are made of a semiconductor; and a storage region having two-dimensional space, which is provided between the gate electrode and the conduction region with an insulating film in between. The memory device operates by a quantum mechanical tunnel effect allowing the transfer of an electric charge between the conduction region and the storage region. That is, the writing of data is performed by storing in the storage region an electric charge transferring from the conduction region to the storage region, whereas the erasing of data is performed by the transfer of an electric charge previously stored in the storage region to the conduction region. The reading of data is performed by measuring the conductivity of the conduction region for an electric potential of the gate electrode and the amount of electric current passing through the conduction region. A series of above-mentioned functions of the memory device (the writing, erasing and reading of data, and so on) is made executable by applying a predetermined electric potential to one gate electrode according to the above-mentioned functions.

However, the conventional memory device has the following malfunction because the memory device is operated by the application of an electric potential to one gate electrode. That is, for example, when an electric potential is applied to one gate electrode at the time of the reading of data, the action of the application of the electric potential causes a change in an electric potential between the conduction region and the storage region. In this case, the change in the electric potential between the conduction region and the storage region causes the transfer of an additional electric charge from the conduction region to the storage region, or the transfer of a part of electric charge previously stored in the storage region to the conduction region. Therefore, the writing or erasing of data is unintentionally performed at the time of the reading of data, so that written data cannot be accurately read out.

SUMMARY OF THE INVENTION

The invention is designed to overcome the foregoing problem. It is an object of the invention to provide a memory device capable of accurately reading out data, a method of manufacturing the same, and an integrated circuit.

A memory device of the invention comprises an underlayer portion made of an insulator; a first control electrode provided on a surface of the underlayer portion; a conduction region made of a semiconductor, provided so as to correspond to the first control electrode; a second control electrode provided in a region opposite to a region in which the first control electrode is provided, with the conduction region between the first and second control electrodes; a first impurity region provided adjacent to the conduction region; a second impurity region provided apart from the first impurity region and adjacent to the conduction region; a storage region provided in either a region between the first control electrode and the conduction region or a region between the second control electrode and the conduction region, the storage region for storing an electric charge transferring from the conduction region; a tunnel insulating film provided in a region between the storage region and the conduction region; a first control insulating film provided between the first control electrode and the conduction region; and a second control insulating film provided between the second control electrode and the conduction region. Incidentally, an arrangement of the first control electrode includes not only the above-mentioned arrangement in which the first control electrode is formed on a surface of the underlayer portion, but also an arrangement in which the first control electrode is formed in a concave portion provided in a part of the underlayer portion.

In the memory device of the invention, an electric potential is applied to at least one of the first control electrode and the second control electrode, whereby an electric charge transfers between the conduction region and the storage region, so that the writing or erasing of data, or the like is performed. The conductivity of the conduction region for the electric potential of at least one of the first and second control electrodes and the amount of electric current passing through the conduction region are measured, whereby the reading of data is performed. Since the reading of data is performed in a state in which an electric potential is applied to the first control electrode, a change in an electric potential between the conduction region and the storage region is prevented.

A method of manufacturing a memory device of the invention includes the steps of forming a first control electrode on an underlayer portion made of an insulator; forming a conduction region made of a semiconductor so as to correspond to the first control electrode; forming a second control electrode in a region opposite to a region in which the first control electrode is provided, with the conduction region between the first and second control electrodes; forming a first impurity region adjacent to the conduction region; forming a second impurity region apart from the first impurity region and adjacent to the conduction region; forming a storage region made of a plurality of dispersed particles in either a region between the first control electrode and the conduction region or a region between the second control electrode and the conduction region; forming a tunnel insulating film in a region between the storage region and the conduction region; forming a first control insulating film between the first control electrode and the conduction region; and forming a second control insulating film between the second control electrode and the conduction region. Incidentally, the above-mentioned first control electrode is formed not only on the underlayer portion as mentioned above, but also in a concave portion provided in a part of the underlayer portion.

In the method of manufacturing a memory device of the invention, the first control electrode and the second control electrode are formed in such a manner that the conduction region and the storage region are sandwiched in between the first control electrode and the second control electrode.

In an integrated circuit of the invention on which a plurality of memory devices are integrated, each of the memory devices has an underlayer portion made of an insulator; a first control electrode provided on a surface of the underlayer portion; a conduction region made of a semiconductor, provided so as to correspond to the first control electrode; a second control electrode provided in a region opposite to a region in which the first control electrode is provided, with the conduction region between the first and second control electrodes; a first impurity region provided adjacent to the conduction region; a second impurity region provided apart from the first impurity region and adjacent to the conduction region; a storage region provided in either a region between the first control electrode and the conduction region or a region between the second control electrode and the conduction region, the storage region for storing an electric charge transferring from the conduction region; a tunnel insulating film provided in a region between the storage region and the conduction region; a first control insulating film provided between the first control electrode and the conduction region; and a second control insulating film provided between the second control electrode and the conduction region.

Incidentally, an arrangement of the first control electrode includes not only the above-mentioned arrangement in which the first control electrode is formed on a surface of the underlayer portion, but also an arrangement in which the first control electrode is formed in a concave portion provided in a part of the underlayer portion.

The integrated circuit of the invention uses the memory device of the invention. Since the reading of data is performed in a state in which an electric potential is applied to the first control electrode, a change in an electric potential between the conduction region and the storage region is prevented.

Other and further objects, features and advantages of the invention will appear more fully from the following description.

BRIEF DESCRIPTION OF THE DRAWINGS

FIG. 27 is a circuit diagram for describing a circuit configuration of the integrated circuit shown in FIG. 25;

DETAILED DESCRIPTION OF THE PREFERRED EMBODIMENTS

Figure 1:
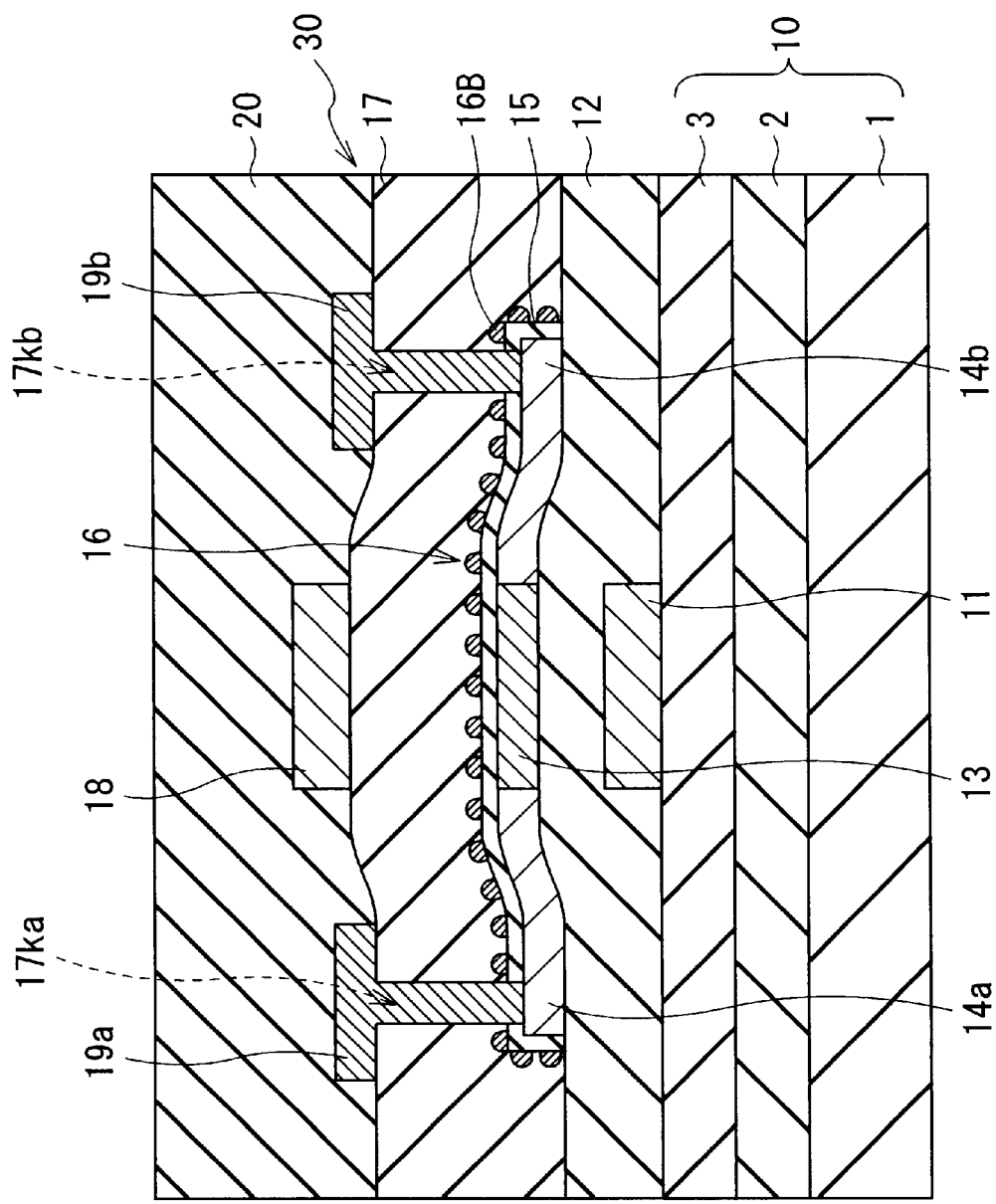
FIG. 1 is a cross sectional view for describing a configuration of a memory device according to a first embodiment of the invention.

Embodiments of the invention will be described in detail below with reference to the drawings.

First Embodiment
<Configuration of Memory Device>

Firstly, a general configuration of a memory device according to a first embodiment of the invention will be described with reference to FIG. 1. For example, the memory device according to the embodiment comprises an underlayer portion 10, a memory transistor 30 formed on the underlayer portion 10, and a cap film 20 formed so as to coat the memory transistor 30.

For example, the underlayer portion 10 comprises a substrate 1 made of silicate glass, silica glass or the like having relatively low heat resistance; an insulating film 2 made of silicon nitride ($Si_3N_4$), which is formed on one surface of the substrate 1; and an insulating film 3 made of silicon dioxide ($SiO_2$), which is formed on the insulating film 2. The insulating films 2 and 3 function as a buffer layer. The thicknesses of the substrate 1, the insulating film 2 and the insulating film 3 are, for example, about 0.4 mm, about 100 nm and about 100 nm, respectively. The substrate 1 may be made of a material containing resin and having relatively low heat resistance similarly to the silicate glass or the like, e.g., plastic or the like, as well as the above-mentioned silicate glass or the like. For example, a storage region 16 having a predetermined configuration makes it possible to use the material having relatively low heat resistance as the substrate 1. The description is given later with regard to the details of the configuration of the storage region 16 associated with the material of the substrate 1.

The cap film 20 is made of, for example, silicon nitride or silicon dioxide and serves to protect the memory transistor 30 from the outside.

The memory transistor 30 comprises a first control electrode 11 provided on the underlayer portion 10, a first control insulating film 12 provided so as to coat the first control electrode 11, a conduction region 13 provided on the first control insulating film 12, a first impurity region 14a located adjacent to the conduction region 13, a second impurity region 14b located apart from the first impurity region 14a and adjacent to the conduction region 13, a tunnel insulating film 15 provided so as to coat the conduction region 13, the first impurity region 14a and the second impurity region 14b, a storage region 16 made of a plurality of semiconductor particles 16B provided on the tunnel insulating film 15, a source electrode 19a connected to the first impurity region 14a, a drain electrode 19b connected to the second impurity region 14b, a second control insulating film 17 provided so as to coat the storage region 16 and so on, and a second control electrode 18 formed on the second control insulating film 17.

The second control electrode 18 functions as "a gate electrode" in the memory transistor 30 and also controls the conductivity of the conduction region 13 and the amount of electric charge stored in the storage region 16. When a predetermined electric potential is applied to the first control electrode 11 at the time of, mainly, "the reading of data" to be described later, the first control electrode 11 serves to prevent a change in an electric potential between the conduction region 13 and the storage region 16 and thereby prevent the transfer of an electric charge resulting from the change in the electric potential. The first control electrode 11 also functions to control the conductivity of the conduction region 13 and so on, similar to the second control electrode 18. Both the first control electrode 11 and the second control electrode 18 are made of, for example, a non-single-crystal semiconductor such as polycrystalline silicon (Si) or amorphous silicon which is doped with an impurity and thus has low resistance, and each of the first and second control electrodes 11 and 18 has a thickness of about 100 nm. The above-mentioned impurity is, for example, a Group V element such as phosphorus (P) for serving as an n-type impurity, a Group III element such as boron (B) for serving as a p-type impurity, or the like. The first control electrode 11 and the second control electrode 18 may be made of metal having low resistance, e.g., tantalum (Ta), molybdenum (Mo), aluminum (Al), copper (Cu), tungsten (W) or the like, as well as the above-mentioned non-single-crystal semiconductor.

The conduction region 13 functions as a current path, i.e., a path through which an electric charge transfers between the first impurity region 14a and the second impurity region 14b, and the conduction region 13 is made of a non-single-crystal semiconductor, e.g., polycrystalline silicon. The conduction region 13 is designed so that the thickness thereof may lie between, for example, 0.01 $\mu$m and 0.1 $\mu$m both inclusive, and specifically, the thickness is about a few tens of nanometers.

The first impurity region 14a functions as "a source region" in the memory transistor 30 and is made of a non-single-crystal semiconductor, e.g., polycrystalline silicon (an n-type semiconductor) doped with a Group V element such as phosphorus (P) for serving as an n-type impurity. The second impurity region 14b functions as "a drain region" in the memory transistor 30 and is made of, for example, the same material (an n-type semiconductor) as the material of the first impurity region 14a. Each of the first and second impurity regions 14a and 14b has a thickness of about a few tens of nanometers, for example.

In other words, the memory transistor 30 has an n-channel type structure, for example. The conduction region 13, each of the first impurity region 14a and the second impurity region 14b may be made of, for example, amorphous silicon, as well as the above-mentioned polycrystalline silicon.

The storage region 16 serves to store an electric charge (an electron in the embodiment) transferred by a quantum mechanical tunnel effect. The storage region 16 is made of, for example, a plurality of dispersed particles (semiconductor particles 16B) made of a semiconductor containing at least one of silicon and germanium (Ge). A plurality of particles, which the storage region 16 is made of, may be made of metal such as tungsten, copper, aluminum or gold (Au), silicon nitride, or the like, as well as the above-mentioned semiconductor.

The tunnel insulating film 15 provides electrical isolation between the conduction region 13 and the storage region 16 and is made of, for example, silicon dioxide, silicon nitride, a compound (siliconoxynitride) of nitrogen, oxygen and silicon, or the like. The tunnel insulating film 15 has a thickness of about 2 nm to 20 nm, for example.

As described above, in the memory device, for example, the tunnel insulating film 15, the storage region 16 and the second control insulating film 17 are provided in a region between the conduction region 13 and the second control electrode 18.

Both the source electrode 19a and the drain electrode 19b are made of, for example, metal having low resistance, such as aluminum or copper. The source electrode 19a is in ohmic contact with the first impurity region 14a, and the drain electrode 19b is in ohmic contact with the second impurity region 14b.

The first control insulating film 12 serves to electrically isolate the first control electrode 11 from a peripheral region around the first control electrode 11, and the second control insulating film 17 serves to electrically isolate the second control electrode 18 from a peripheral region around the second control electrode 18. Both the first control insulating film 12 and the second control insulating film 17 are made of, for example, the same material as the material of the tunnel insulating film 15. One (i.e., the first control insulating film 12) of the first control insulating film 12 and the second control insulating film 17, which does not include the storage region 16 with reference to a position of the conduction region 13, has less thickness than a thickness of the other (i.e., the second control insulating film 17). Specifically, for example, the thickness of the one not including the storage region 16 (e.g., 25 nm) is about ½ time the thickness of the other including the storage region 16 (e.g., 50 nm).

In genera, a plurality of memory transistors 30 are provided on the same underlayer portion 10, that is, a plurality of memory devices are integrated and then used. Integration of the memory devices will be described later.

<Functions of Memory Device>

Next, functions of the memory device (mainly, the writing, holding, erasing and reading of data) will be described with reference to FIG. 1. Hereinafter, for example, it is assumed that the memory transistor 30 has an n-channel type structure and the first impurity region 14a (the source region) is grounded (an electric potential E0 of the first impurity region 14a is equal to 0 V).

<<Writing of Data>>

The memory device performs "the writing of data" in the following manner. For example, in a state in which an electric potential of the first control electrode 11 is at 0 V, an electric potential of the second impurity region 14b is equalized with the electric potential (E0) of the first impurity region 14a, and a higher electric potential E1 than the electric potential (E0) of the first impurity region 14a (e.g., E1=+20 V, E1>E0) is applied to the second control electrode 18, whereby a quantum mechanical tunnel effect allows an electric charge (an electron in the embodiment) to transfer from the conduction region 13 to the storage region 16, so that "the writing of data" is performed. The above-described "writing of data" is performed in the same manner, also when an electric potential E2, which is higher than the electric potential (E0) of the first impurity region 14a and is lower than the electric potential (E1) of the second control electrode 18, (e.g., E2=+10 V, E0<E2<E1) is applied to the second impurity region 14b. The electric charge transferring from the conduction region 13 to the storage region 16 is stored in the storage region 16.

<<Holding of Data>>

For example, the respective electric potentials of the first control electrode 11, the first impurity region 14a, the second impurity region 14b and the second control electrode 18 are made floating (e.g., 0 V), or the electric potentials are made equal, whereby an electric charge is kept stored in the storage region 16, so that written data is held.

<<Erasing of Data>>

For example, the electric potentials of the first control electrode 11 and the second impurity region 14b are equalized with the electric potential (E0) of the first impurity region 14a, and a lower electric potential E3 than the electric potential (E0) of the first impurity region 14a (e.g., E3=−20 V, E3<E0) is applied to the second control electrode 18, whereby an electric charge previously stored in the storage region 16 transfers to the conduction region 13 by a quantum mechanical tunnel effect, so that "the erasing of data" is performed.

<<Reading of Data>>

For example, in a state in which the electric potential of the second control electrode 18 is at 0 V, a positive electric potential E4 (e.g., E4=+5 V) is applied to the first control electrode 11, and the conductivity of the conduction region 13 for the electric potential of the first control electrode 11 or the amount of electric current passing through the conduction region 13 is measured, whereby the amount of electric charge stored in the storage region 16 is detected, so that "the reading of data" is performed. Specifically, for example, the amount of electric current passing through the conduction region 13 in a state in which an electric charge is stored in the storage region 16 is smaller than the amount of electric current passing through the conduction region 13 in a state in which no electric charge is stored in the storage region 16. On the other hand, the amount of electric current passing through the conduction region 13 in a state in which no electric charge is stored in the storage region 16 is larger than the amount of electric current passing through the conduction region 13 in a state in which an electric charge is stored in the storage region 16. That is, the amount of electric current passing through the conduction region 13 changes according to a state in which an electric charge or no electric charge is stored in the storage region 16. A change in the amount of electric current passing through the conduction region 13 (or the conductivity) is measured, whereby a state in which an electric charge or no electric charge is stored in the storage region 16, namely, "written data" is read out.

In the memory device, the first control electrode 11 substantially faces the second control electrode 18 with the conduction region 13, the storage region 16 and so on in between. At the time of "the reading of data", an electric potential is applied to the first control electrode 11, so that this application allows preventing a change in an electric potential between the conduction region 13 and the storage region 16 at the time of the application of an electric potential, as distinct from the application of an electric potential to only the second control electrode 18. This prevents the transfer of an electric charge between the conduction region 13 and the storage region 16, thereby preventing unintentional writing or erasing of data at the time of "the reading of data". That is, written data is accurately read out.

<Method of Manufacturing Memory Device>

Next, a method of manufacturing the memory device will be described with reference to FIGS. 1 to 6.

Figure 2:
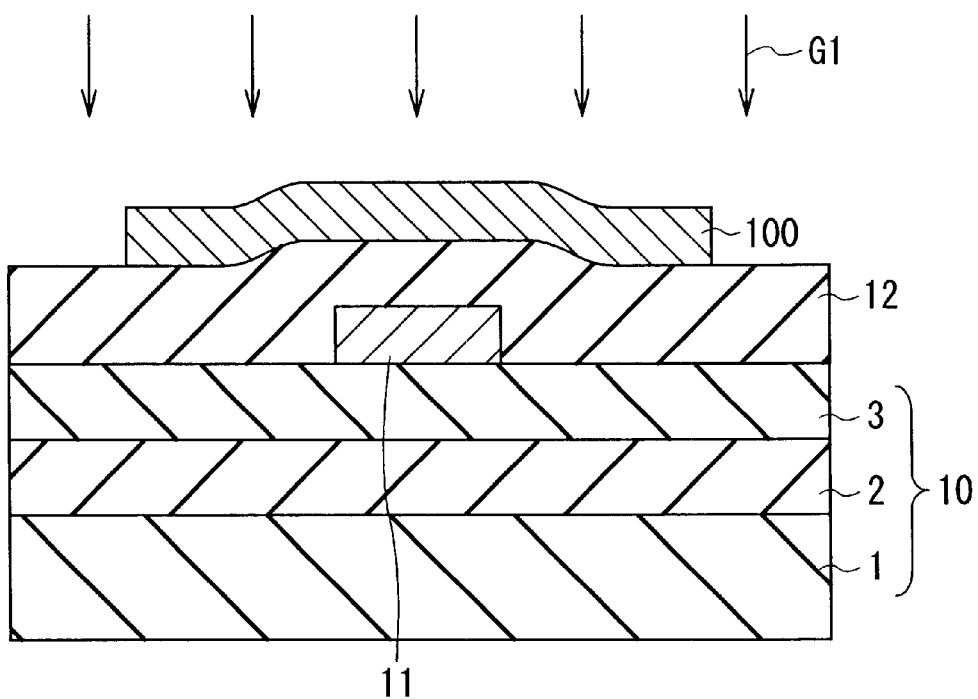
FIG. 2 is a cross sectional view for describing a step of a method of manufacturing the memory device according to the first embodiment of the invention.

The memory device is manufactured in the following manner. First, as shown in FIG. 2, the insulating film 2 made of silicon nitride is formed with a thickness of about 100 nm on the substrate 1 made of, for example, silica glass or the like by means of chemical vapor deposition (hereinafter referred to as "CVD") or sputtering. Then, the insulating film 3 made of silicon dioxide is formed with a thickness of about 100 nm on the insulating film 2 by the same method as the method of forming the insulating film 2, for example. Thus, the underlayer portion 10 on which the memory transistor 30 is to be formed is formed.

Then, the first control electrode 11 made of non-single-crystal silicon (polycrystalline silicon or amorphous silicon) doped with an impurity is selectively formed on the underlayer portion 10 (the insulating film 3) by means of CVD or sputtering under the condition that a substrate temperature lies between about 600 and 700° C., for example. Besides the above-described method, a method in which a metal layer such as tantalum is formed by means of sputtering and then the metal layer is etched and thus patterned, for example, may be used as a method of forming the first control electrode 11.

Then, the first control insulating film 12 made of silicon dioxide, silicon nitride or siliconoxynitride is formed with a thickness of about 25 nm by means of CVD in, for example, a mixed gas of a gas containing atoms of silicon (Si), such as silane ($SiH_4$) or disilane ($Si_2H_6$), and a gas containing atoms of oxygen (O), such as oxygen ($O_2$) or nitrous oxide ($N_2O$), so as to coat both the underlayer portion 10 and the first control electrode 11. Besides the above-described method, a method in which silicon is deposited by means of sputtering in a gaseous atmosphere containing atoms of oxygen, such as oxygen or nitrous oxide, for example, may be used as a method of forming the first control insulating film 12.

Then, a non-single-crystal silicon (polycrystalline silicon or amorphous silicon) layer is formed on the first control insulating film 12 by means of CVD or sputtering under the condition that a substrate temperature lies between about 600 and 700° C., for example. Then, the non-single-crystal silicon layer is patterned by etching and thus isolation takes place, whereby a semiconductor layer 100 is selectively formed with a thickness of a few tens of nanometers. The semiconductor layer 100 is subjected to ion implantation in the following step, whereby the semiconductor layer 100 is formed into the conduction region 13, the first impurity region 14a and the second impurity region 14b.

Figure 3:
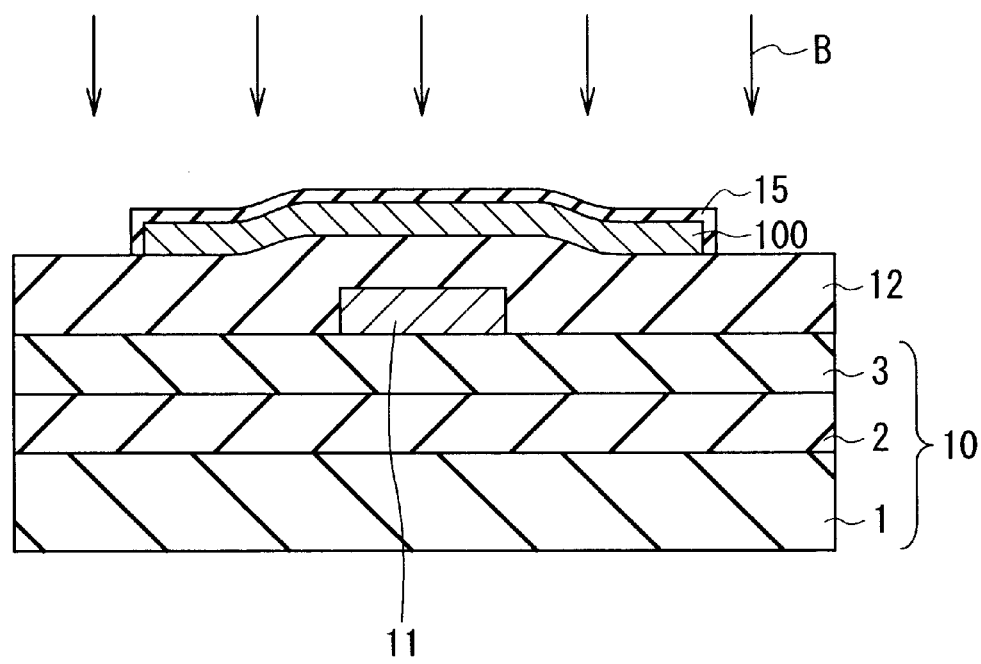
FIG. 3 is a cross sectional view for describing a step following the step of FIG. 2.

Then, the semiconductor layer 100 is exposed to an atmosphere of an ionized gas G1 containing atoms of oxygen under the condition that a substrate temperature is, for example, about 150° C., whereby a surface of the semiconductor layer 100 is oxidized. Generation of the ionized gas G1 is accomplished by introducing an oxygen gas of about 80 Pa into an alternating electromagnetic field of 13.6 MHz and 350 W, for example. The tunnel insulating film 15 made of silicon dioxide is formed by this oxidation process, as shown in FIG. 3. For the above-mentioned oxidation process, for example, the conditions for oxidation are controlled so that the tunnel insulating film 15 to be formed may have a thickness of about 10 nm. Many structural defects exist in the tunnel insulating film 15 and on an interface between the tunnel insulating film 15 and the semiconductor layer 100. Besides the above-described method, thermal oxidation or CVD, for example, may be used as a method of forming the tunnel insulating film 15.

Then, for example, the tunnel insulating film 15 is irradiated with an energy beam B, and thus both the tunnel insulating film 15 and the semiconductor layer 100 are heated. For instance, an excimer laser beam, an electron beam or the like is used as the energy beam B. Used is an excimer laser made of, for example, xenon chloride (XeCl) (with a wavelength of 308 nm), krypton fluoride (KrF) (with a wavelength of 248 nm), argon fluoride (ArF) (with a wavelength of 193 nm) or the like.

The time for irradiation with the energy beam B is, for example, about 100 nsec, and a surface temperature of the semiconductor layer 100 is higher than a surface temperature of the tunnel insulating film 15 under formation. At the time of heat treatment, only the temperature of the tunnel insulating film 15 and the surface temperature of the semiconductor layer 100 rise instantaneously, and the temperature of the underlayer portion 10 does not rise. This heat treatment allows modifying film properties of the tunnel insulating film 15, thereby reducing the structural defects in the tunnel insulating film 15 and on the interface between the tunnel insulating film 15 and the semiconductor layer 100.

Figure 4:
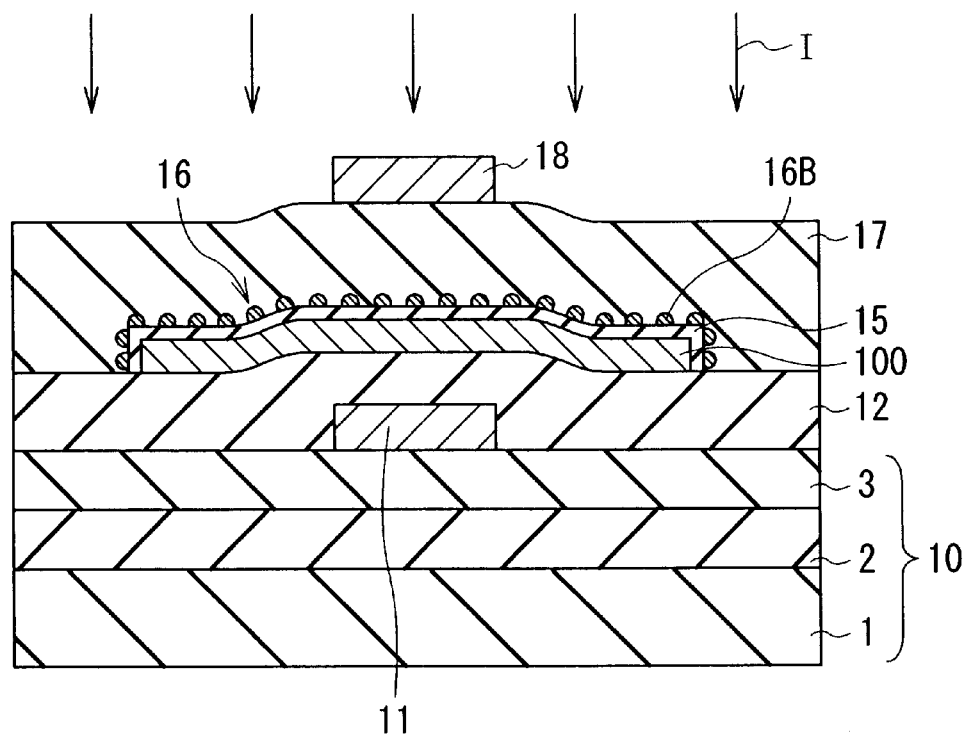
FIG. 4 is a cross sectional view for describing a step following the step of FIG. 3.

Then, as shown in FIG. 4, a plurality of semiconductor particles 16B made of a semiconductor material containing at least one of silicon and germanium are deposited by means of, for example, CVD so as to coat the tunnel insulating film 15, and thus the storage region 16 made of a plurality of semiconductor particles 16B is formed. The above-mentioned deposition of the semiconductor particles 16B by CVD takes place in, for example, a mixed gas of a gas containing atoms of silicon, such as silane or disilane, and a gas containing atoms of germanium, such as germane ($GeH_4$). To form the storage region 16, for example, the semiconductor particles 16B are deposited on the tunnel insulating film 15 in such a manner that the coverage of the tunnel insulating film 15 is less than 1. Besides the above-mentioned semiconductor material, a metallic material such as tungsten, copper, aluminum or gold, silicon nitride or the like may be used as a material of a plurality of particles which the storage region 16 is made of Then, the second control insulating film 17 is formed with a thickness of about 50 nm by using, for example, the same material and method as the material and method for forming the first control insulating film 12, so as to coat the overall surface.

Then, the second control electrode 18 is selectively formed on the second control insulating film 17 by using, for example, the same material and method as the material and method for forming the first control electrode 11. For instance, the second control electrode 18 is formed at such a position that the second control electrode 18 substantially faces the first control electrode 11 with the storage region 16, the semiconductor layer 100 and so on in between.

Figure 5:
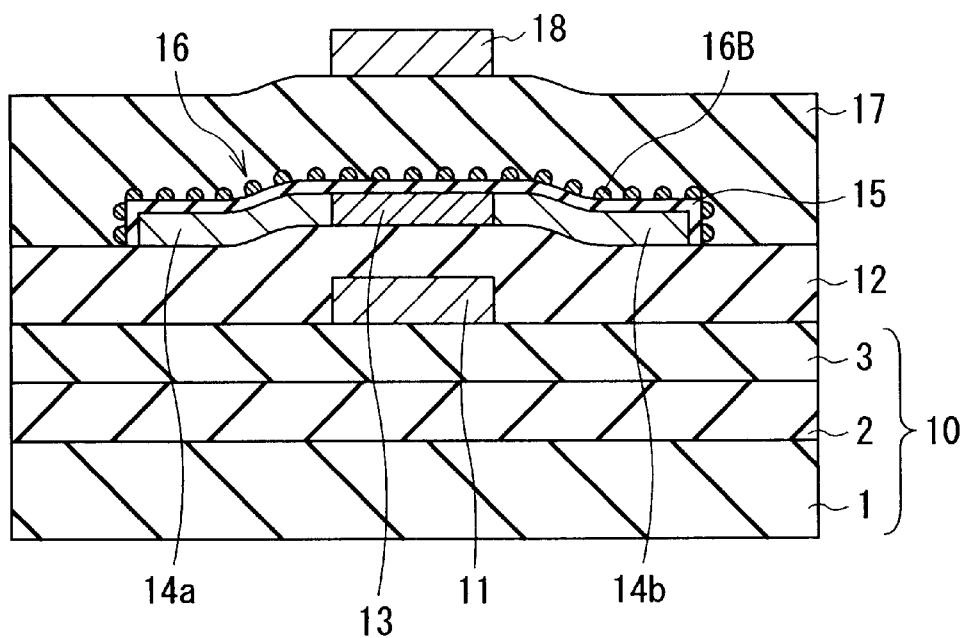
FIG. 5 is a cross sectional view for describing a step following the step of FIG. 4.

Then, an impurity I is injected into the semiconductor layer 100 by means of ion implantation using the second control electrode 18 as a mask, for example. For instance, a Group V element such as phosphorus (an n-type impurity) is used as the impurity I. By this ion implantation, the first impurity region 14a and the second impurity region 14b are selectively formed as shown in FIG. 5. A region of the semiconductor layer 100 between the first impurity region 14a and the second impurity region 14b forms the conduction region 13.

Then, for example, the first impurity region 14a and the second impurity region 14b are irradiated with an energy beam by use of an excimer laser. This beam irradiation allows activating the impurity (phosphorus) with which the first impurity region 14a and the second impurity region 14b are doped.

Figure 6:
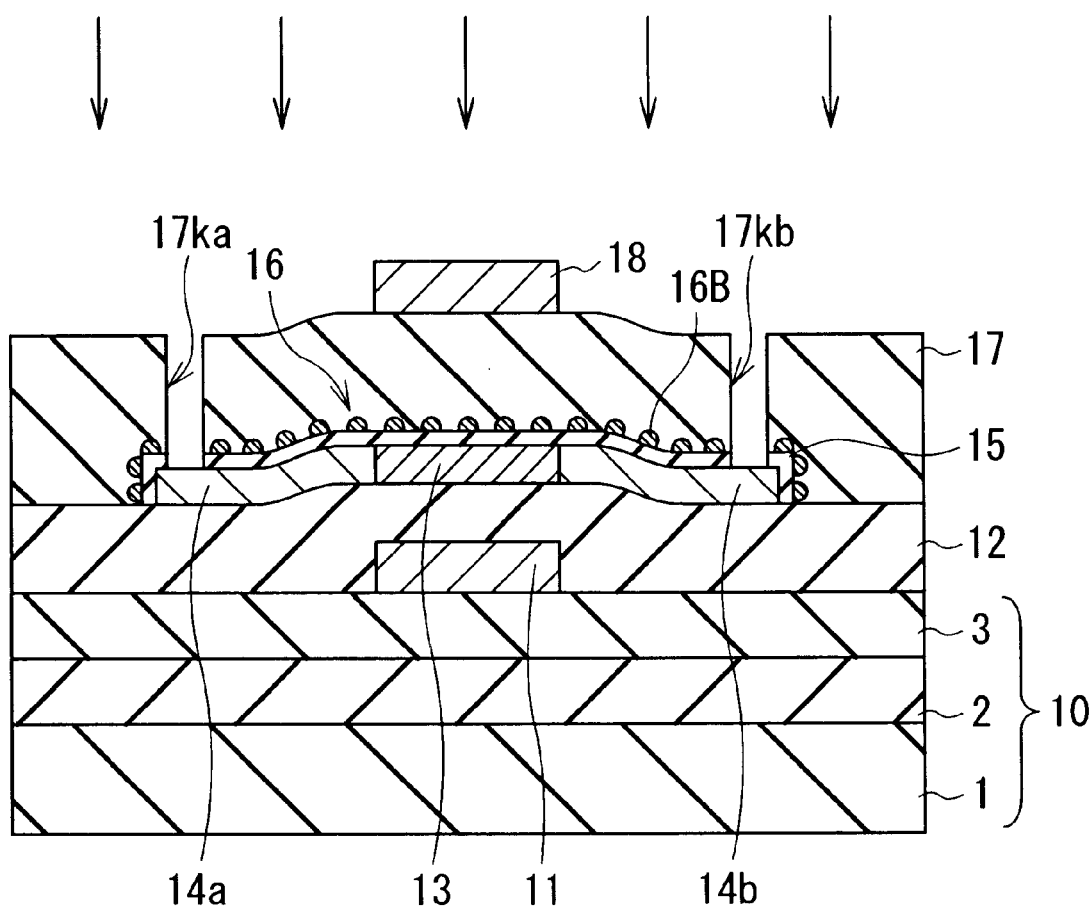
FIG. 6 is a cross sectional view for describing a step following the step of FIG. 5.

Then, for example, the respective regions of the second control insulating film 17 corresponding to the first impurity region 14a and the second impurity region 14b are selectively etched as shown in FIG. 6. This etching process selectively removes the tunnel insulating film 15 and the storage region 16 (the semiconductor particles 16B) on and over the first impurity region 14a and the second impurity region 14b, thereby forming openings 17ka and 17kb. The first impurity region 14a is exposed in the opening 17ka, and the second impurity region 14b is exposed in the opening 17kb.

Then, as shown in FIG. 1, by means of, for example, vacuum evaporation, the source electrode 19a is selectively formed in the opening 17ka so as to be connected to an exposed portion of the first impurity region 14a, and the drain electrode 19b is selectively formed in the opening 17kb so as to be connected to an exposed portion of the second impurity region 14b. For instance, metal having low resistance, such as aluminum or copper, is used as a material of both the source electrode 19a and the drain electrode 19b. Thus, the memory transistor 30 is formed on the underlayer portion 10.

Finally, the cap film 20 made of silicon nitride or silicon dioxide is formed by means of, for example, CVD or sputtering so as to coat the overall surface, and thus the memory device is completed.

<Functions and Advantages of Memory Device>

As described above, in the memory device according to the embodiment, at the time of "the reading of data", an electric potential is applied to the first control electrode 11 located opposite to the second control electrode 18 with the storage region 16 in between, so that the transfer of an electric charge resulting from a change in an electric potential between the conduction region 13 and the storage region 16 is prevented. Therefore, unintentional writing or erasing of data is prevented at the time of the reading of data, so that written data can be accurately read out.

Moreover, in the embodiment, the storage region 16 is made of a plurality of dispersed semiconductor particles 16B, so that the following function allows preventing unintentional "erasing of data". That is, for example, when the storage region has two-dimensional space, a part of electric charge stored in the storage region leaks through defective regions in the tunnel insulating film, if structural defects occurs in the tunnel insulating film by manufacturing factors (a forming temperature and so on). In this case, the unintentional "erasing of data" occurs due to the phenomenon of leakage of electric charge. On the other hand, in the embodiment, each electric charge transferring to the storage region 16 is dispersedly stored in each of the semiconductor particles 16B. Thus, even if structural defects occur in the tunnel insulating film 15 and thus electric charges previously stored in some semiconductor particles 16B leak through defective regions in the tunnel insulating film 15, electric charges stored in the semiconductor particles 16B other than "some semiconductor particles 16B" remain stored in the storage region 16. Therefore, the phenomenon of leakage of electric charge resulting from a defective structure in the tunnel insulating film 15, namely, the unintentional "erasing of data" is prevented, so that written data can be held with stability for a long time.

Moreover, in the embodiment, the thickness of the conduction region 13 lies between 0.01 $\mu$m and 0.1 $\mu$m both inclusive, so that the memory transistor 30 of high performance, which includes the conduction region 13 made of non-single-crystal silicon that is properly crystallized through the irradiation with the energy beam B, can be configured.

Moreover, in the embodiment, the thickness of the first control insulating film 12 is less than the thickness of the second control insulating film 17, so that a distance between the first control insulating film 12 and the storage region 16 is shorter than a distance between the second control electrode 18 and the storage region 16. In this case, at the time of "the reading of data", a lower electric potential (E4) than an electric potential required for the second control electrode 18 is applied to the first control electrode 11, whereby the memory transistor 30 can be driven. Therefore, power consumption required for driving the memory transistor 30 can be reduced.

<Functions and Advantages of Method of Manufacturing Memory Device>

In the method of manufacturing the memory device according to the embodiment, a plurality of semiconductor particles 16B are dispersedly deposited by means of CVD in such a manner that the coverage of the tunnel insulating film 15 is less than 1, and the storage region 16 is made of a plurality of semiconductor particles 16B, so that the storage region 16 is easily formed. Therefore, the memory device can be easily manufactured and embodied. The advantage of the above-mentioned "easy formation of the storage region 16" is obtained in the same manner, also in the case of forming the storage region 16 made of metallic particles by means of sputtering.

Moreover, in the embodiment, the semiconductor layer 100 is exposed to the ionized gas G1 containing atoms of oxygen so as to form the tunnel insulating film 15, so that this exposure enables the tunnel insulating film 15 to be formed under the temperature conditions that a processing temperature is relatively low (e.g., 150° C.), as compared to thermal oxidation requiring the temperature conditions that the processing temperature is relatively high (e.g., 800 to 1000° C.). Therefore, manufacturing conditions (temperature conditions) under which the tunnel insulating film 15 is to be formed can be simplified.

Moreover, in the embodiment, the tunnel insulating film 15 is irradiated with the energy beam B after forming the tunnel insulating film 15, so that the structural defects in the tunnel insulating film 15 and on the interface between the tunnel insulating film 15 and the conduction region 13 can be reduced without a rise in the temperature of the underlayer portion 10. The phenomenon of leakage of electric charge is prevented from occurring in these defective regions, so that this prevention also contributes to stabilized "holding of data".

Moreover, the embodiment has the following advantage because the temperature at which the tunnel insulating film 15 is formed is lowered as described above. That is, for example, to form the tunnel insulating film 15 by thermally oxidizing a surface of the conduction region 13 under the temperature conditions that the processing temperature is relatively high (e.g., 800 to 1000° C.), the material of the substrate 1 is limited to a material having relatively high heat resistance, which is capable of resisting the above-mentioned high-temperature environment, (e.g., silicon). On the other hand, in the embodiment, the tunnel insulating film 15 can be formed under the temperature conditions that the processing temperature be relatively low (e.g., 150° C.), so that a material having relatively low heat resistance can be selected as the material of the substrate 1, and therefore the material of the substrate 1 is chosen from a wider variety of materials. Specifically, a material that is relatively cheaper than silicon, such as the above-mentioned materials, i.e., glass materials such as silicate glass and silica glass, resin materials such as plastic, and so on, can be used as the material of the substrate 1.

In the embodiment, the description is given with regard to the case where all of the conduction region 13, the first impurity region 14a and the second impurity region 14b are made of polycrystalline silicon or amorphous silicon, but the invention is not necessarily limited to this embodiment. For example, the conduction region 13 and the first and second impurity regions 14a and 14b may be made of amorphous silicon (or polycrystalline silicon) and polycrystalline silicon (or amorphous silicon), respectively.

Second Embodiment

Next, a memory device according to a second embodiment of the invention will be described with reference to FIGS. 1 to 6.

The memory device according to the second embodiment has the first impurity region 14a and the second impurity region 14b, both of which are made of a p-type semiconductor, as distinct from the memory device according to the above-described first embodiment in which both the first impurity region 14a and the second impurity region 14b are made of an n-type semiconductor. A configuration of the memory device according to the second embodiment, a method of forming the memory device and so on are the same as those of the memory device according to the above-described first embodiment, except for the above-mentioned configuration. Hereinafter, the same components as the components of the above-described first embodiment are indicated by the same reference numerals, and the detailed description of the same components is appropriately omitted.

In the memory device, both the first impurity region 14a and the second impurity region 14b shown in FIG. 1 are made of a non-single-crystal semiconductor, e.g., polycrystalline silicon (a p-type semiconductor) doped with a Group III element such as boron for serving as a p-type impurity. That is, the memory transistor 30 has a p-channel type structure, for instance. The storage region 16 is adapted to store a hole as an electric charge, as distinct from the storage region 16 of the above-described first embodiment.

In the memory device, the writing, holding, erasing and reading of data are performed by the application of an electric potential of a sign opposite to a sign of the electric potential of the first embodiment. That is, in FIG. 1, for example, in a state in which the electric potential of the first control electrode 11 is at 0 V, the electric potential of the second impurity region 14b is equalized with the electric potential (E0) of the first impurity region 14a, and a lower electric potential E5 than the electric potential (E0) of the first impurity region 14a (e.g., E5=−20 V, E5<E0) is applied to the second control electrode 18, whereby a quantum mechanical tunnel effect allows an electric charge (a hole in the second embodiment) to transfer from the conduction region 13 to the storage region 16, so that "the writing of data" is performed. The above-described "writing of data" is performed in the same manner, also when an electric potential E6, which is lower than the electric potential (E0) of the first impurity region 14a and is higher than the electric potential (E5) of the second control electrode 18, (e.g., E6=−10 V, E5<E6<E0) is applied to the second impurity region 14b.

For example, the respective electric potentials of the first control electrode 11, the first impurity region 14a, the second impurity region 14b and the second control electrode 18 are made floating (e.g., 0 V), or the electric potentials are made equal, whereby an electric charge (a hole) is kept stored in the storage region 16, so that written data is held.

For example, the electric potentials of the first control electrode 11 and the second impurity region 14b are equalized with the electric potential (E0) of the first impurity region 14a, and a higher electric potential E7 than the electric potential (E0) of the first impurity region 14a (e.g., E7=+20 V, E7>E0) is applied to the second control electrode 18, whereby an electric charge previously stored in the storage region 16 transfers to the conduction region 13 by a quantum mechanical tunnel effect, so that "the erasing of data" is performed.

For example, in a state in which the electric potential of the second control electrode 18 is at 0 V, a negative electric potential E8 (e.g., E8=−5 V) is applied to the first control electrode 11, and the conductivity of the conduction region 13 for the electric potential of the first control electrode 11 or the amount of electric current passing through the conduction region 13 is measured, whereby the amount of electric charge stored in the storage region 16 is detected, so that "the reading of data" is performed. Specifically, for example, the amount of electric current passing through the conduction region 13 in a state in which an electric charge is stored in the storage region 16 is smaller than the amount of electric current passing through the conduction region 13 in a state in which no electric charge is stored in the storage region 16. On the other hand, the amount of electric current passing through the conduction region 13 in a state in which no electric charge is stored in the storage region 16 is larger than the amount of electric current passing through the conduction region 13 in a state in which an electric charge is stored in the storage region 16.

The memory device is manufactured through the following steps. Of the steps of manufacturing the memory device, the step of forming the second control electrode 18 and the preceding steps are the same as the corresponding steps of the above-described first embodiment (see FIGS. 2 to 4), and thus the description thereof is omitted. After forming the second control electrode 18 through the above-mentioned steps, as shown in FIG. 4, the impurity I (a p-type impurity) is injected into the semiconductor layer 100 by means of ion implantation using the second control electrode 18 as a mask, and thus the first impurity region 14a and the second impurity region 14b, which are made of a p-type semiconductor, are selectively formed. For example, a Group III element such as boron is used as the impurity (a p-type impurity) to be injected. After forming both the first impurity region 14a and the second impurity region 14b, the step of forming the openings 17ka and 17kb and the following steps are the same as the above-described steps of the aforementioned first embodiment (see FIGS. 6 and 1). The memory device according to the second embodiment is formed through the above-described steps.

Advantages, modifications and the like of the memory device according to the second embodiment are the same as those of the memory device according to the above-described first embodiment.

Third Embodiment

Next, a memory device according to a third embodiment of the invention will be described with reference to FIGS. 7 to 10.

The memory device according to the third embodiment has a storage region 41 and a tunnel insulating film 42, both of which are provided in a region between the first control electrode 11 and a conduction region 43, as distinct from the memory devices according to the above-described first and second embodiments in which both the tunnel insulating film 15 and the storage region 16 are provided in the region between the conduction region 13 and the second control electrode 18. In FIGS. 7 to 10, the same components as the components of the above-described first embodiment are indicated by the same reference numerals, and the detailed description of the same components is appropriately omitted.

Figure 7:
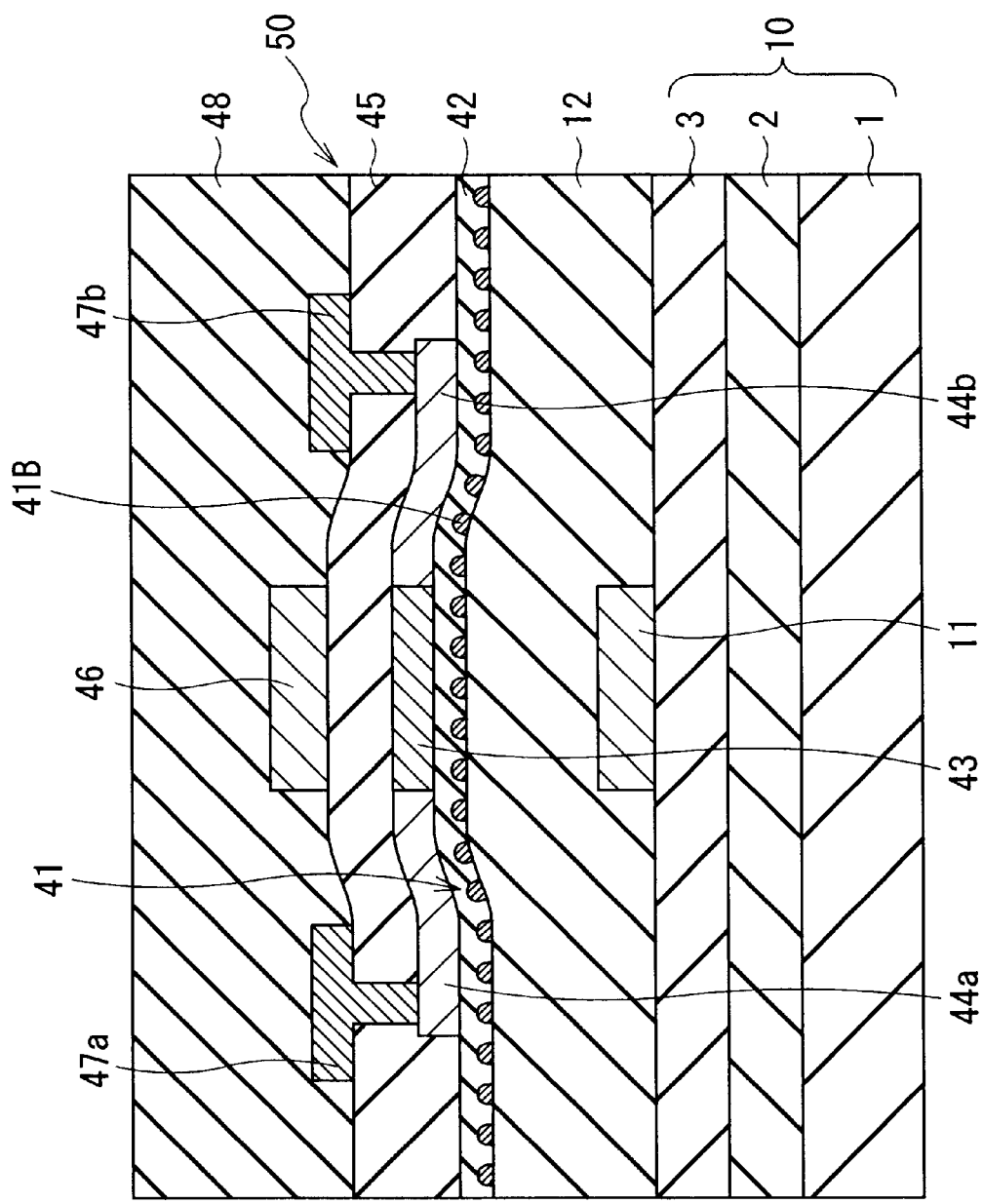
FIG. 7 is a cross sectional view for describing a configuration of a memory device according to a third embodiment of the invention.

In the memory device, as shown in FIG. 7, both the storage region 41 and the tunnel insulating film 42 are provided on the first control insulating film 12, and the conduction region 43, a first impurity region 44a, a second impurity region 44b and so on are provided on the tunnel insulating film 42. One (i.e., a second control insulating film 45) of the first control insulating film 12 and the second control insulating film 45, which does not include the storage region 41 with reference to a position of the conduction region 43, has less thickness than a thickness of the other (i.e., the first control insulating film 12). Specifically, for example, the thickness of the former (e.g., 25 nm) is about ½ time the thickness of the latter (e.g., 50 nm). Functions, structural features and the like of the parts (e.g., the conduction region 43 and so on) of the memory device of the third embodiment, except for the above-described parts, are the same as those of the parts (e.g., the conduction region 13 and so on) of the memory device of the above-described first embodiment (see FIG. 1), which have the same names as the parts of the memory device of the third embodiment have. A memory transistor 50 to be formed on the underlayer portion 10 may have an n-channel type structure or a p-channel type structure.

In the memory device, for example, the writing, holding, erasing and reading of data are performed by the above-described functions of the above-mentioned first embodiment when the memory transistor 50 has the n-channel type structure, or by the above-described functions of the above-mentioned second embodiment when the memory transistor 50 has the p-channel type structure. To operate the memory device, electric potentials are applied to "the first control electrode 11" and "a second control electrode 46", which replace "the second control electrode 18" and "the first control electrode 11", respectively, which are given in the description of "the functions of the memory device" of the above-mentioned first and second embodiments.

Figure 8:
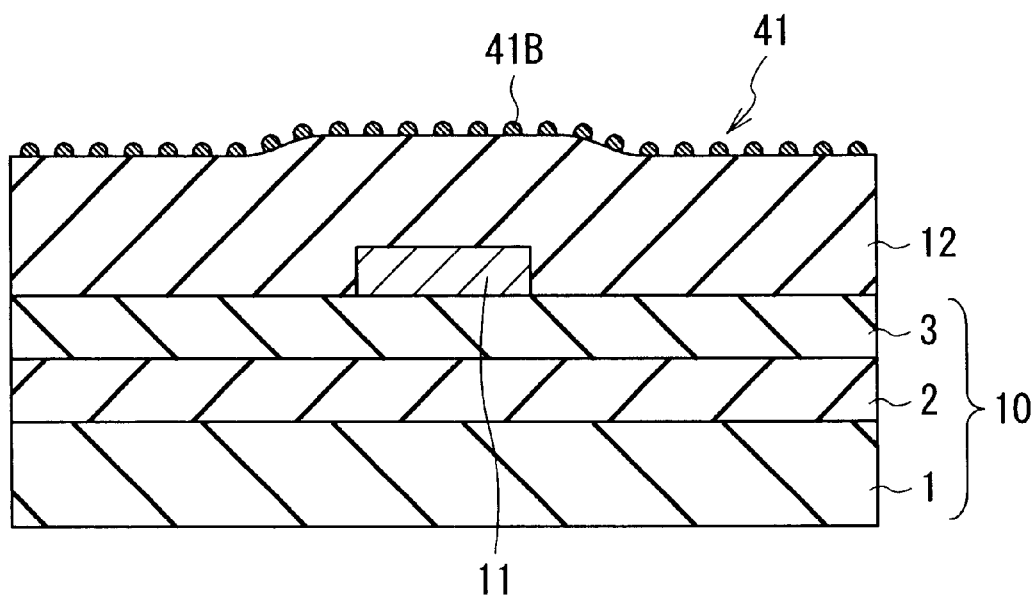
FIG. 8 is a cross sectional view for describing a step of a method of manufacturing the memory device according to the third embodiment of the invention.

The memory device is manufactured through the following steps, for example. Of the steps of manufacturing the memory device, the step of forming the first control insulating film 12 and the preceding steps are the same as the corresponding steps of the above-described first embodiment (see FIG. 2), and thus the description thereof is omitted. After forming the first control insulating film 12 through the above-mentioned steps, as shown in FIG. 8, a plurality of particles 41B are deposited so as to coat the first control insulating film 12, and thus the storage region 41 made of a plurality of particles 41B is formed. A material of the storage region 41 (the particles 41B), a method of forming the storage region 41, and structural features and the like of the storage region 41 are the same as those of the storage region 16 of the above-described first embodiment, for example.

Figure 9:
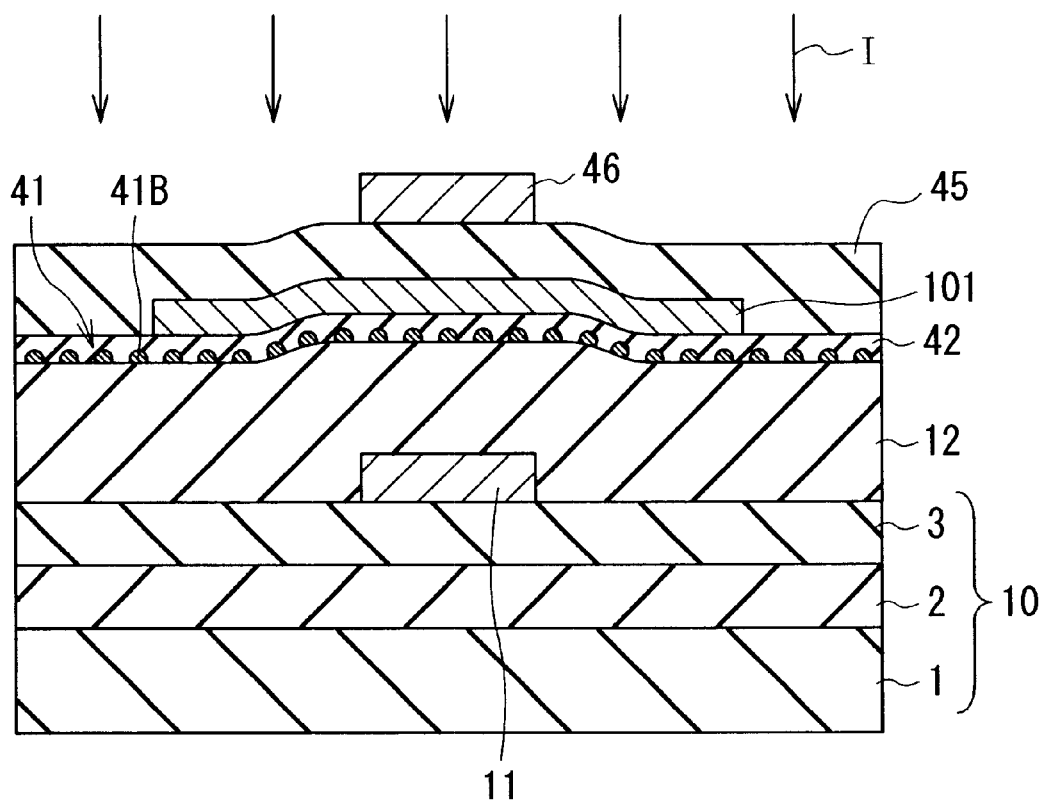
FIG. 9 is a cross sectional view for describing a step following the step of FIG. 8.

Then, as shown in FIG. 9, the tunnel insulating film 42 is formed with a thickness of a few tens of nanometers so as to coat the storage region 41 (the particles 41B). Then, a non-single-crystal silicon (polycrystalline silicon or amorphous silicon) layer (not shown) is formed on the tunnel insulating film 42. After that, the non-single-crystal silicon layer is patterned by etching and thus isolation takes place, whereby a semiconductor layer 101 is selectively formed with a thickness of a few tens of nanometers. Then, the second control insulating film 45 is formed with a thickness of about 100 nm so as to coat the overall surface. Then, a surface of the second control insulating film 45 is exposed to the ionized gas G1 (not shown), and thus structural defects on an interface between the second control insulating film 45 and the semiconductor layer 101 are reduced. Then, the second control electrode 46 is selectively formed on the second control insulating film 45. Materials of the tunnel insulating film 42, the semiconductor layer 101, the second control insulating film 45 and the second control electrode 46, methods of forming the same, and structural features and the like of the same are the same as those of the tunnel insulating film 15, the semiconductor layer 100, the second control insulating film 17 and the second control electrode 18 of the above-described first embodiment, for example.

Then, the impurity I is injected into the semiconductor layer 101 by means of ion implantation using the second control electrode 46 as a mask. For example, phosphorus or the like (an n-type impurity) that is a Group V element is used as the impurity I to form the memory transistor 50 having the n-channel type structure, or boron or the like (a p-type impurity) that is a Group III element is used as the impurity I to form the memory transistor 50 having the p-channel type structure.

Figure 10:
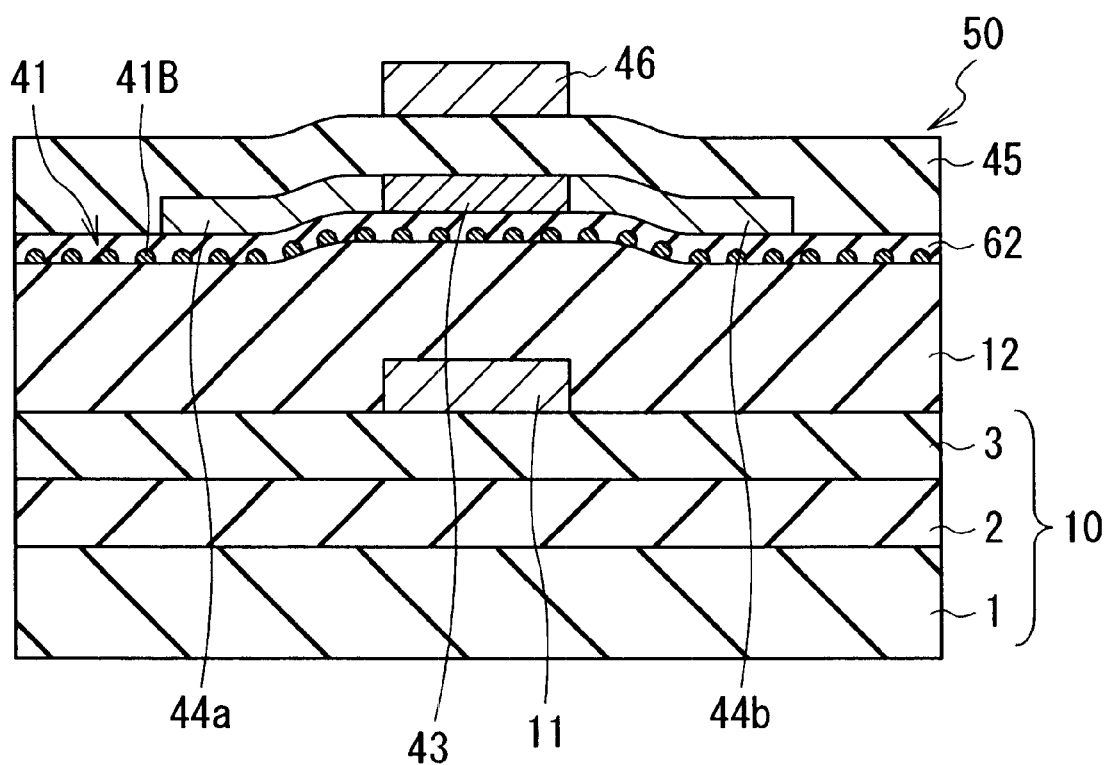
FIG. 10 is a cross sectional view for describing a step following the step of FIG. 9.

Thus, the first impurity region 44a and the second impurity region 44b are selectively formed as shown in FIG. 10. A region of the semiconductor layer 101 between the first impurity region 44a and the second impurity region 44b forms the conduction region 43. Then, both the first impurity region 44a and the second impurity region 44b are irradiated with an energy beam (e.g., an excimer laser), and thus the injected impurity is activated.

Then, as shown in FIG. 7, a source electrode 47a and a drain electrode 47b are selectively formed by using the same method as the method of forming the source electrode 19a and the drain electrode 19b of the above-described first embodiment. Thus, the memory transistor 50 is formed on the underlayer portion 10.

Finally, a cap film 48 is formed so as to coat the overall surface, and thus the memory device is completed. Materials of the source electrode 47a, the drain electrode 47b and the cap film 48, methods of forming the same, and so on are the same as those of the source electrode 19a, the drain electrode 19b and the cap film 20 of the above-described first embodiment, for example.

Advantages, modifications and the like of the memory device according to the third embodiment are the same as those of the memory devices according to the above-described first and second embodiments.

Fourth Embodiment

Figure 12:
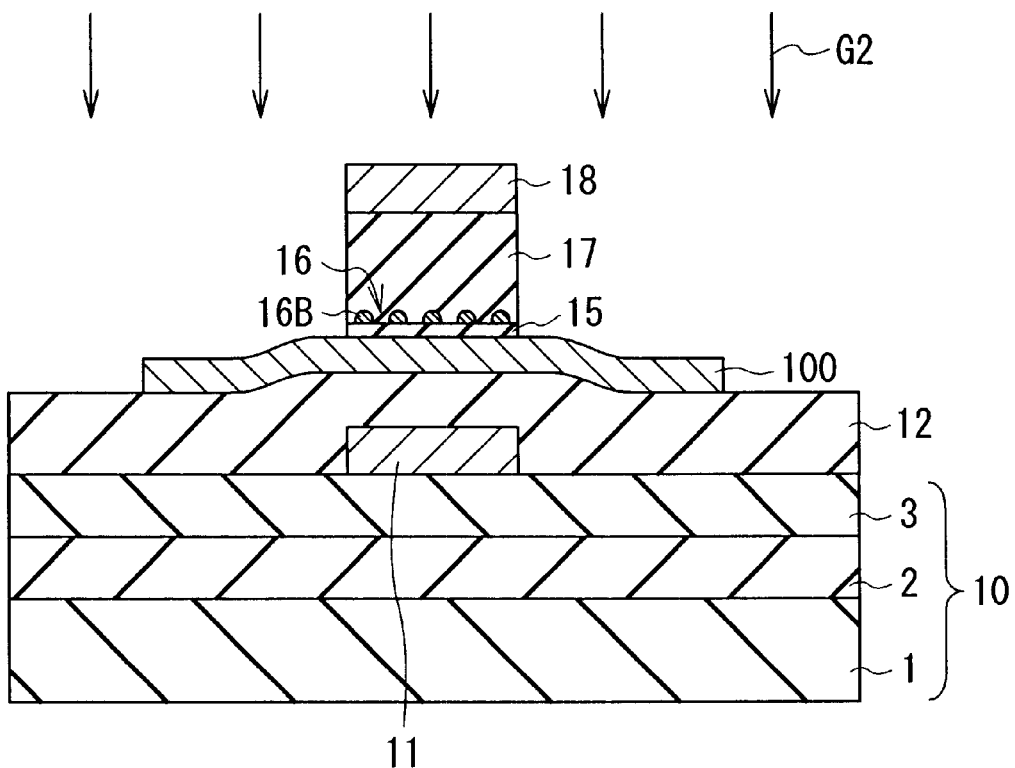
FIG. 12 is a cross sectional view for describing a step of a method of manufacturing the memory device according to the fourth embodiment of the invention.
Figure 13:
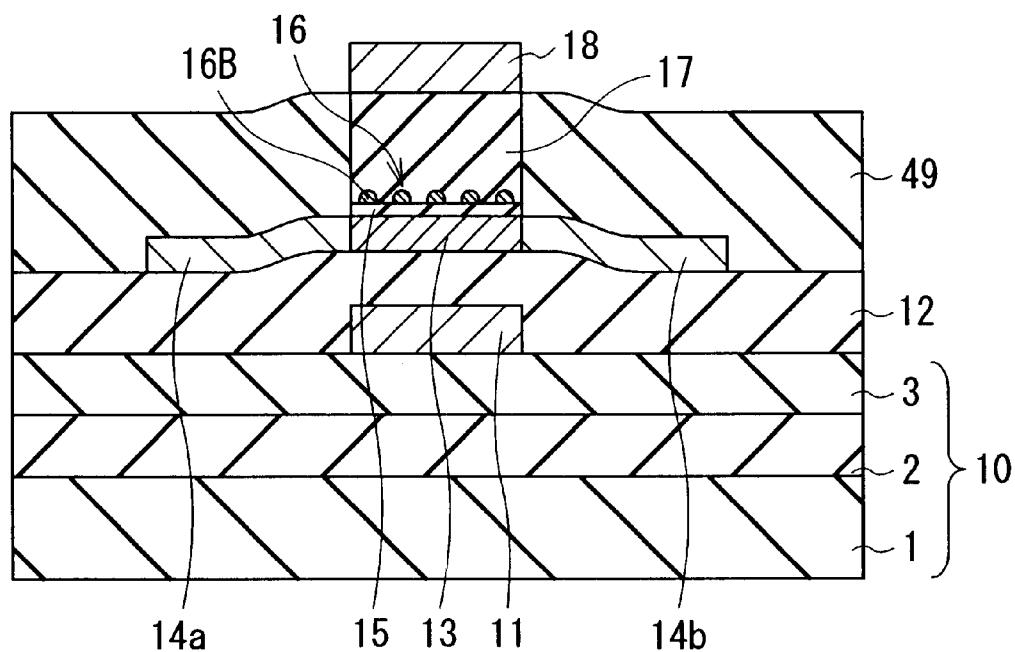
FIG. 13 is a cross sectional view for describing a step following the step of FIG. 12.

Next, a memory device according to a fourth embodiment of the invention will be described with reference to FIGS. 11 to 13.

The memory device according to the fourth embodiment has the same structure as the memory device according to the above-described first embodiment has, except that the tunnel insulating film 15 and the storage region 16 are provided in different regions from the regions provided in the above-described first embodiment (see FIG. 1). A method of manufacturing the memory device according to the fourth embodiment includes a method of forming the first impurity region 14a and the second impurity region 14b (a method of injecting an impurity into the semiconductor layer 100), which is different from the method of forming the regions 14a and 14b of the above-described first embodiment. In FIGS. 11 to 13, the same components as the components of the above-described first embodiment are indicated by the same reference numerals, and the detailed description of the same components is appropriately omitted.

Figure 11:
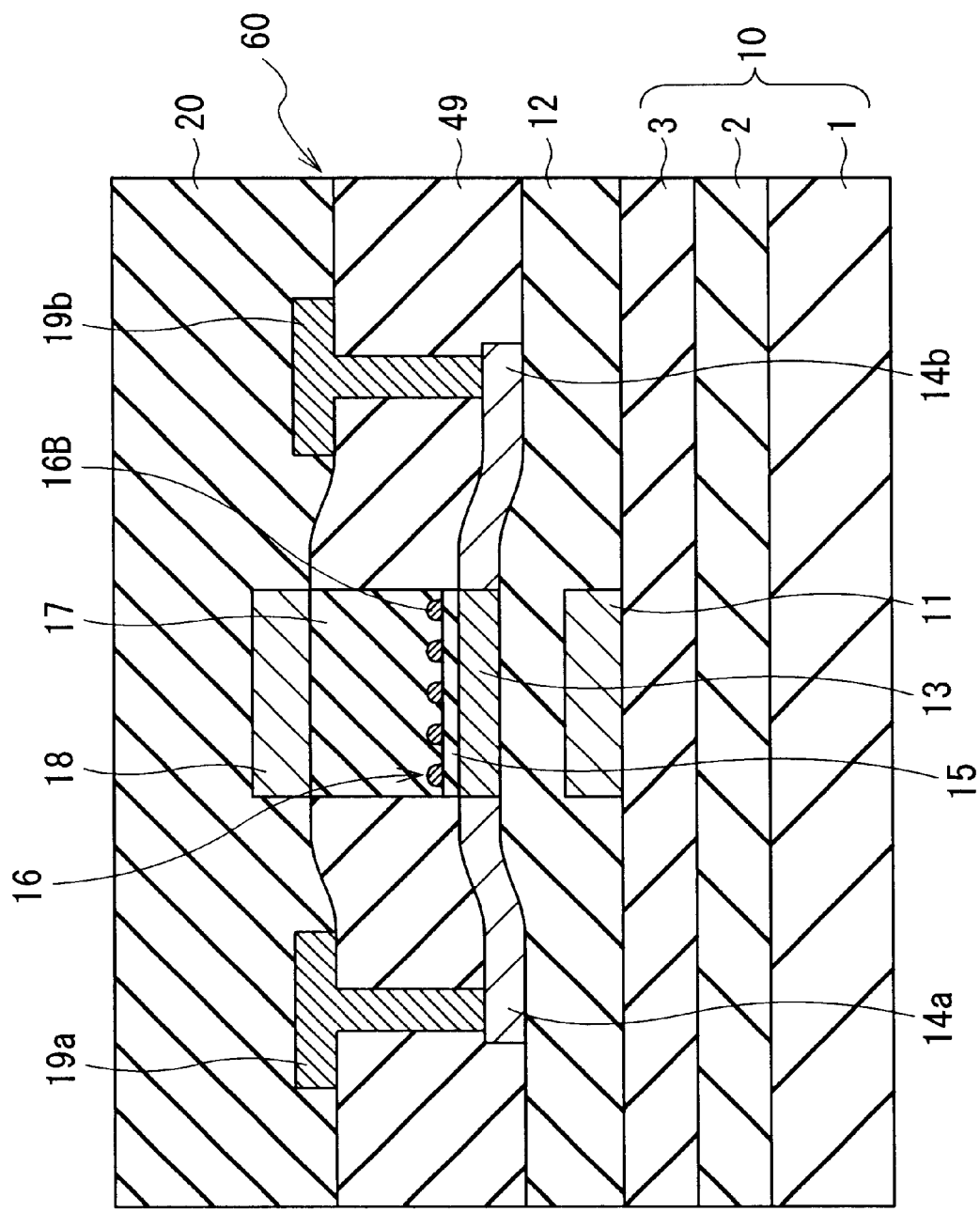
FIG. 11 is a cross sectional view for describing a configuration of a memory device according to a fourth embodiment of the invention.

In the memory device, as shown in FIG. 11, the regions in which the tunnel insulating film 15, the storage region 16 and the second control insulating film 17 are provided are smaller than the regions of the above-described first embodiment (see FIG. 1), and, for example, the regions correspond to the region in which the conduction region 13 is provided. A third control insulating film 49 is provided in a peripheral region other than the regions in which the tunnel insulating film 15 and the like are provided. The third control insulating film 49 is made of the same material as the material of the second control insulating film 17.

In the memory device, the writing, holding, erasing and reading of data are performed by the above-described functions of the above-mentioned first embodiment when a memory transistor 60 has an n-channel type structure, or by the above-described functions of the above-mentioned second embodiment when the memory transistor 60 has a p-channel type structure.

The memory device is manufactured through the following steps, for example. Of the steps of manufacturing the memory device, the step of forming the second control electrode 18 and the preceding steps are the same as the corresponding steps of the above-described first embodiment (see FIG. 4), and thus the description thereof is omitted. After forming the second control electrode 18 through the above-mentioned steps, for example, the overall surface is subjected to etching using a mixed gas of carbon tetrafluoride ($CF_4$) and hydrogen ($H_2$), using the second control electrode 18 as a mask. As shown in FIG. 12, this etching process selectively removes the respective parts of the second control insulating film 17, the storage region 16 (the semiconductor particles 16B) and the tunnel insulating film 15 in regions other than the region in which the second control electrode 18 is provided, so that the semiconductor layer 100 is partly exposed.

Then, for example, an exposed portion of the semiconductor layer 100 is exposed to an atmosphere of an ionized gas G2 containing atoms of predetermined metal for serving as an impurity. For instance, a gas containing a Group V element such as atoms of phosphorus, such as phosphine ($PH_3$), is used as the ionized gas G2 to form the memory transistor 60 having the n-channel type structure, or a gas containing a Group III element such as boron, such as diborane ($B_2H_6$), is used as the ionized gas G2 to form the memory transistor 60 having the p-channel type structure. Thus, as shown in FIG. 13, the impurity is introduced into the exposed portion of the semiconductor layer 100, so that the first impurity region 14a and the second impurity region 14b are selectively formed.

Then, for example, both the first impurity region 14a and the second impurity region 14b are irradiated with an energy beam (e.g., an excimer laser), and thus the introduced impurity is activated.

Then, for example, the third control insulating film 49 is formed so as to coat the substantially overall surface. A material of the third control insulating film 49, a method of forming the third control insulating film 49 and so forth are the same as those of the second control insulating film 17.

Then, as shown in FIG. 11, two openings are formed by selectively removing a part of the third control insulating film 49, and thereafter the source electrode 19a and the drain electrode 19b are selectively formed in the openings. Thus, the memory transistor 60 is formed on the underlayer portion 10. Finally, the cap film 20 is formed so as to coat the overall surface, and thus the memory device is completed.

Advantages, modifications and the like of the memory device according to the fourth embodiment are the same as those of the memory devices according to the above-described first to third embodiments.

Fifth Embodiment

Next, a memory device according to a fifth embodiment of the invention will be described with reference to FIGS. 14 to 17.

The memory device according to the fifth embodiment has the same main structure as, for example, the memory device according to the above-described fourth embodiment has, except that a storage region 72 made of a plurality of dispersed particles 72B is formed within a storage region forming film 71. In FIGS. 14 to 17, the same components as the components of the above-described fourth embodiment are indicated by the same reference numerals, and the detailed description of the same components is appropriately omitted.

Figure 14:
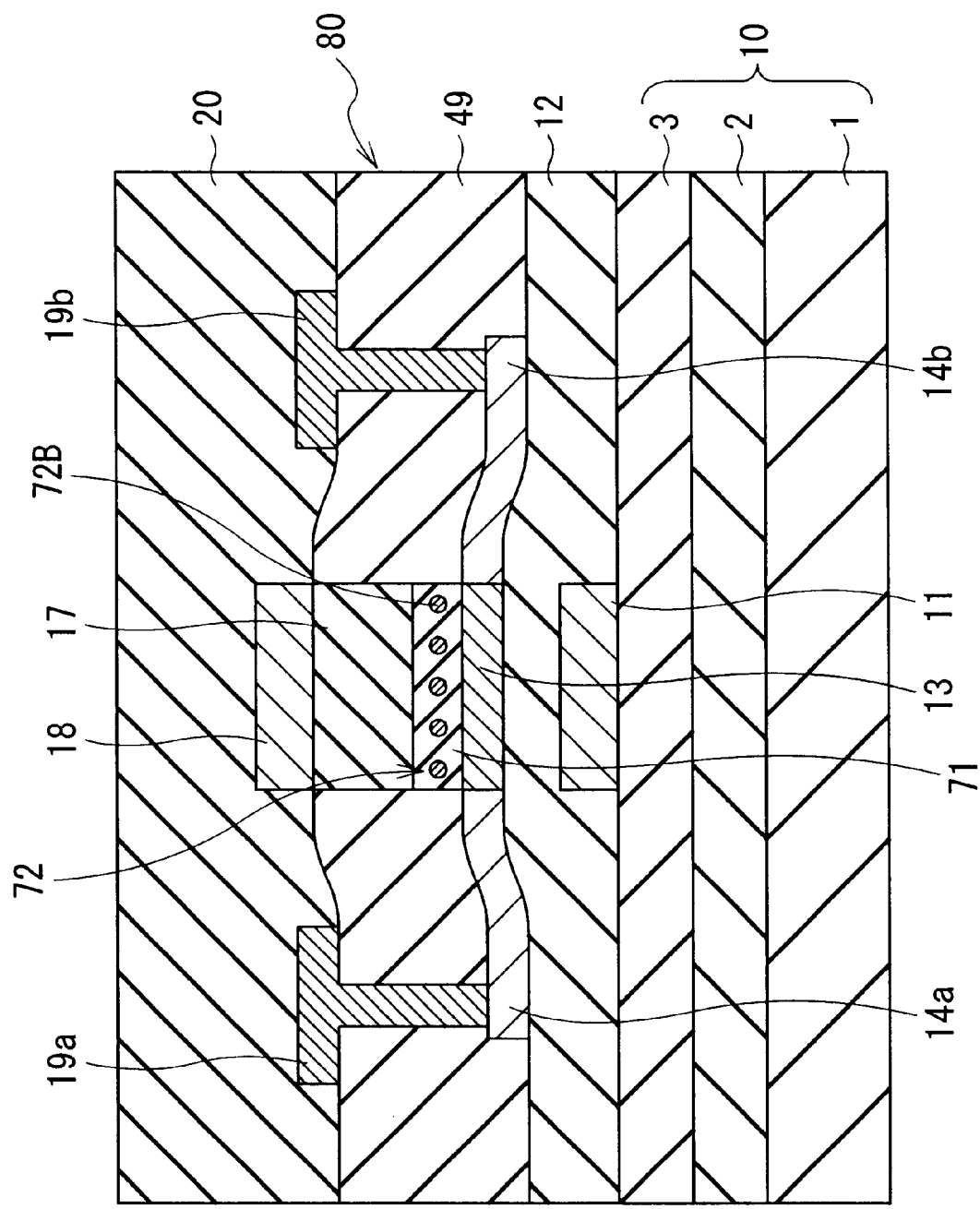
FIG. 14 is a cross sectional view for describing a configuration of a memory device according to a fifth embodiment of the invention.

In the memory device, the storage region forming film 71 is provided in a region between the conduction region 13 and the second control insulating film 17, as shown in FIG. 14. The storage region forming film 71 is made of silicon dioxide, for example. A plurality of particles 72B made of, for example, silicon are dispersed within the storage region forming film 71, and the storage region 72 is made of a plurality of particles 72B. That is, the storage region 72 is formed within the storage region forming film 71. A portion of the storage region forming film 71 in a region between the conduction region 13 and the storage region 72 functions in the same manner as "the tunnel insulating film" described by referring to the above-mentioned first to fourth embodiments.

In a memory transistor 80 of the memory device, the writing, holding, erasing and reading of data are performed by the same functions as the functions of the above-described fourth embodiment.

Figure 15:
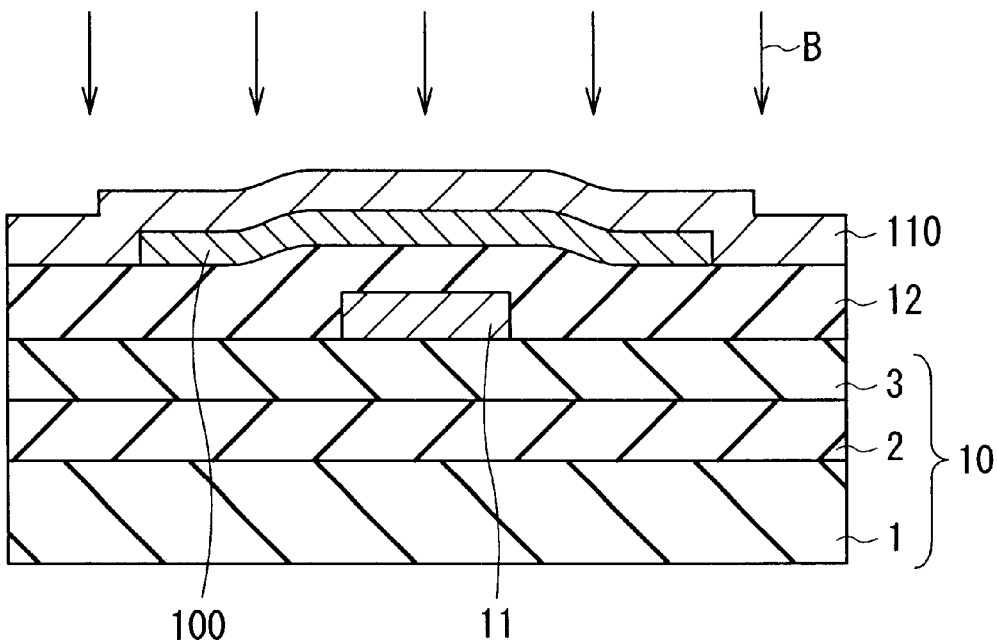
FIG. 15 is a cross sectional view for describing a step of a method of manufacturing the memory device according to the fifth embodiment of the invention.

The memory device is manufactured through the following steps, for example. Of the steps of manufacturing the memory device, the step of forming the semiconductor layer 100 and the preceding steps are the same as the corresponding steps of the above-described first embodiment (see FIG. 2), and thus the description thereof is omitted. After forming the semiconductor layer 100 through the above-mentioned steps, as shown in FIG. 15, a non-stoichiometric film 110 made of oxide containing silicon in excess, i.e., oxide ($SiO_x$; x<2) having a non-stoichiometric composition, is formed with a thickness of a few tens of nanometers by means of, for example, CVD or sputtering so as to coat the overall surface.

Figure 16:
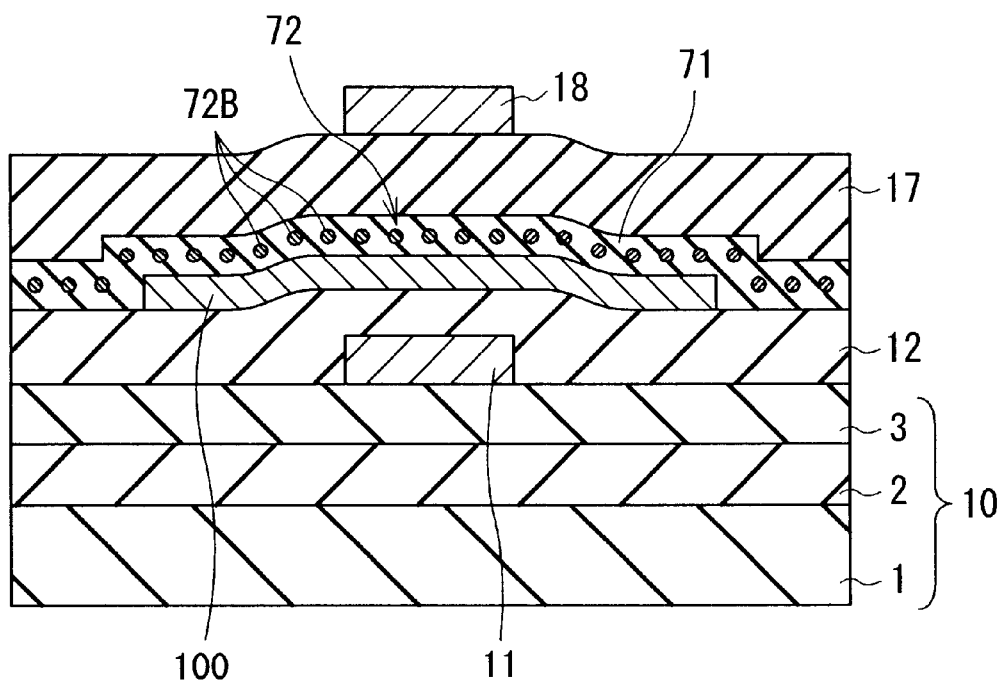
FIG. 16 is a cross sectional view for describing a step following the step of FIG. 15.

Then, for example, the non-stoichiometric film 110 is irradiated with the energy beam B, and thus the non-stoichiometric film 110 is heated. For instance, an excimer laser beam, an electron beam or the like is used as the energy beam B. Used is an excimer laser made of, for example, xenon chloride (XeCl) (with a wavelength of 308 nm), krypton fluoride (KrF) (with a wavelength of 248 nm), argon fluoride (ArF) (with a wavelength of 193 nm) or the like. This heat treatment allows the oxide constituting the non-stoichiometric film 110 to decompose into silicon dioxide and silicon having a stoichiometric composition, as shown in FIG. 16. That is, a plurality of particles 72B made of silicon are dispersed within the storage region forming film 71 made of silicon dioxide, and thus the storage region 72 made of a plurality of particles 72B is formed.

Then, the second control insulating film 17 is formed so as to coat the overall surface, and thereafter the second control electrode 18 is selectively formed on the second control insulating film 17.

Figure 17:
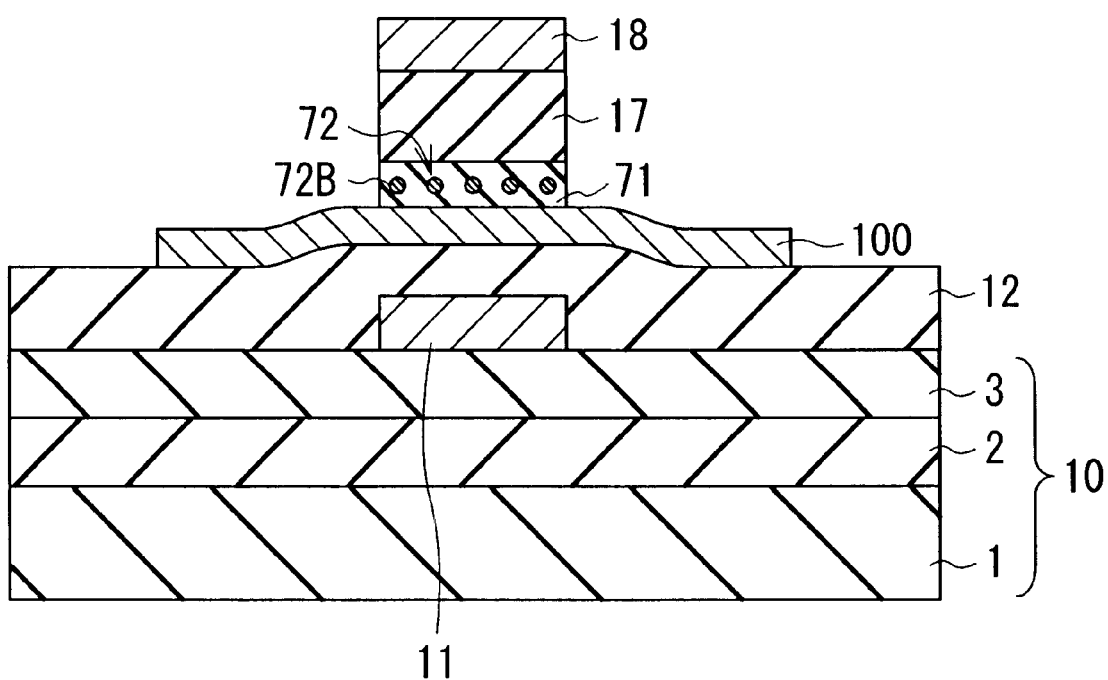
FIG. 17 is a cross sectional view for describing a step following the step of FIG. 16.

Then, as shown in FIG. 17, the overall surface is subjected to etching using a mixed gas of carbon tetrafluoride ($CF_4$) and hydrogen ($H_2$), using the second control electrode 18 as a mask, and this etching process selectively removes the respective parts of the second control insulating film 17 and the storage region forming film 71 (the particles 72B) in regions other than the region in which the second control electrode 18 is provided. The semiconductor layer 100 is partly exposed by this etching process.

The steps following the step of partly exposing the semiconductor layer 100 are the same as, for example, the corresponding steps of the above-described fourth embodiment described with reference to the drawings following FIG. 12, and thus the description thereof is omitted.

Advantages, modifications and the like of the memory device according to the fifth embodiment are the same as those of the memory devices according to the above-described first to fourth embodiments. The structure of and around the storage region 72 of the fifth embodiment (i.e., the structure in which the storage region 72 is provided within the storage region forming film 71) and the method of forming the structure may be applied to the above-described embodiments, exclusive of the fourth embodiment.

Figure 18:
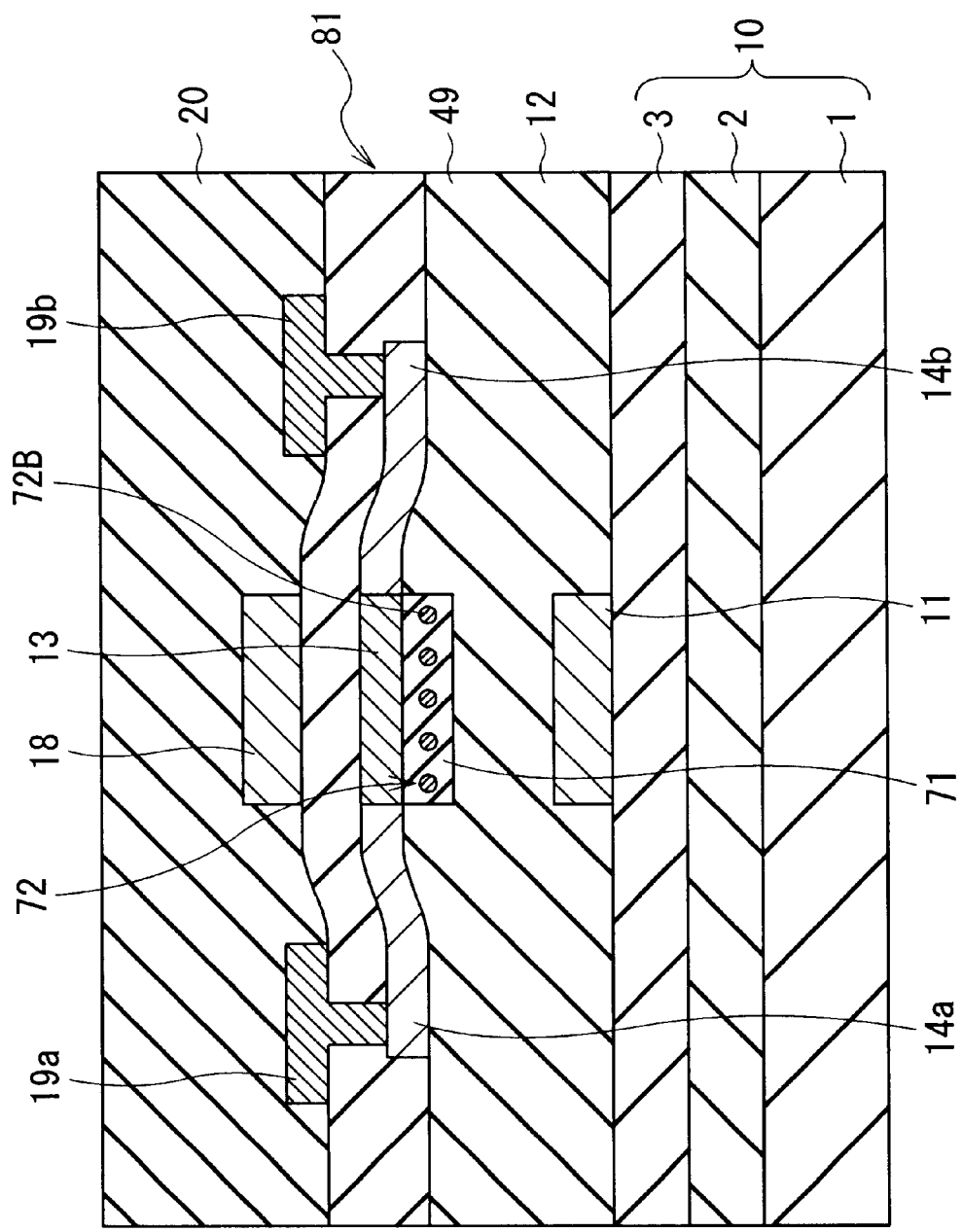
FIG. 18 is a cross sectional view for describing a modification of the memory device according to the fifth embodiment of the invention.

In the fifth embodiment, as shown in FIG. 14, the storage region 72 and so forth are provided in the region between the conduction region 13 and the second control electrode 18, but the invention is not necessarily limited to this embodiment. For example, as shown in FIG. 18, as in the case of the above-described third embodiment, the storage region 72 and so forth may be provided in a region between the conduction region 13 and the first control electrode 11 so as to construct a memory transistor 81. Also in this case, the same functions and advantages as the functions and advantages of the memory device shown in FIG. 14 can be obtained.

Sixth Embodiment

Next, a memory device according to a sixth embodiment of the invention will be described with reference to FIGS. 19 to 22.

The memory device according to the sixth embodiment has a first control electrode 11H, which is provided so as to be filled into a concave portion 3k provided in a part of the underlayer portion 10, as distinct from the memory devices according to the above-described first to fifth embodiments in which the first control electrode 11 is provided on the flat underlayer portion 10. A main structure of the memory device according to the sixth embodiment, except for the above-mentioned structure, is the same as that of the memory device according to the above-described fifth embodiment, for example. In FIGS. 19 to 22, the same components as the components of the above-described fifth embodiment are indicated by the same reference numerals, and the detailed description of the same components is appropriately omitted.

Figure 19:
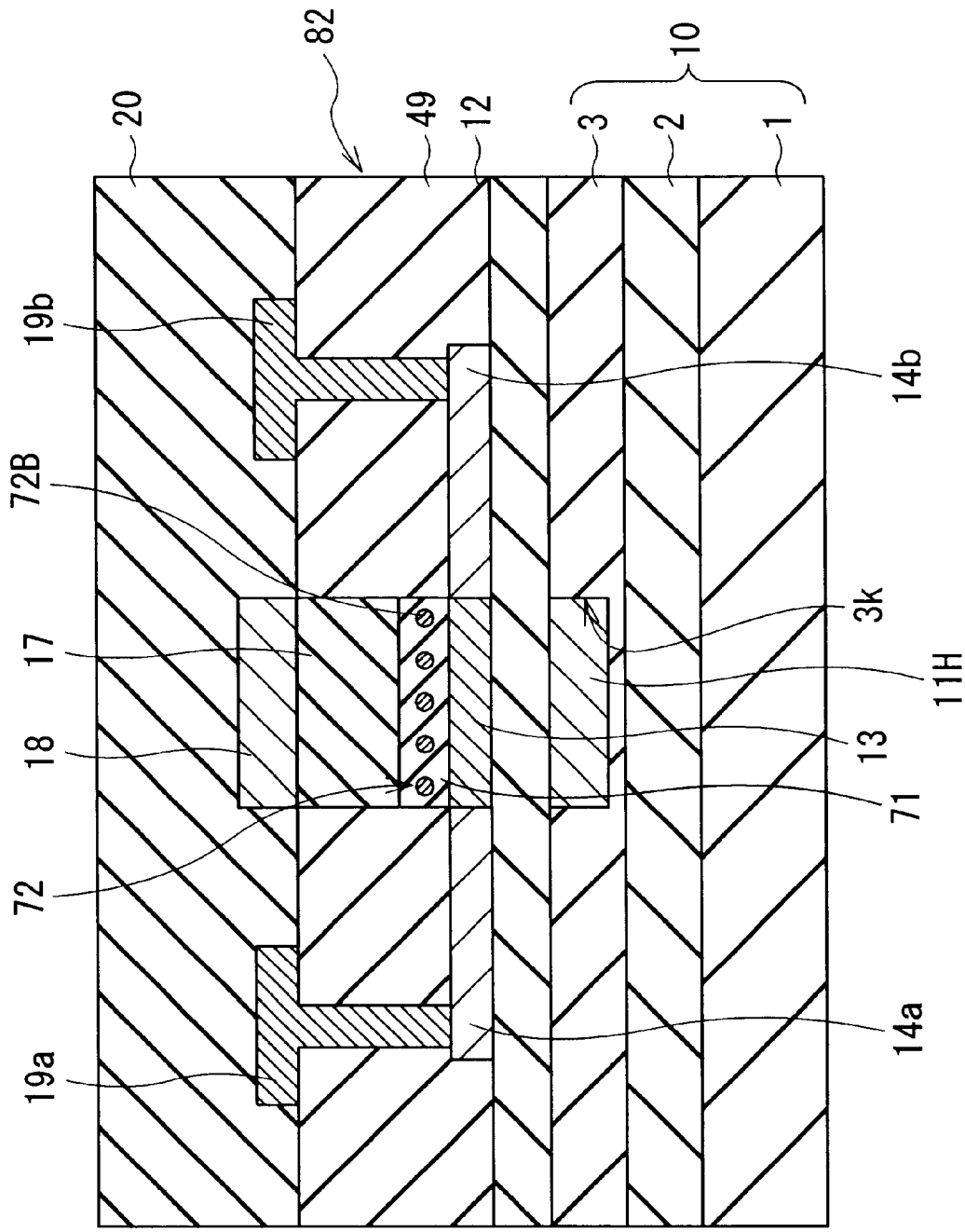
FIG. 19 is a cross sectional view for describing a configuration of a memory device according to a sixth embodiment of the invention.

In the memory device, as shown in FIG. 19, the concave portion 3k is provided in the insulating film 3 constituting a part of the underlayer portion 10, and the first control electrode 11H is provided so that the concave portion 3k is filled with the first control electrode 11H. For example, the position of a surface of the first control electrode 11H substantially matches the position of a surface of the insulating film 3.

In a memory transistor 82 of the memory device, the writing, holding, erasing and reading of data are performed by the same functions as the functions of the above-described fifth embodiment.

Figure 20:
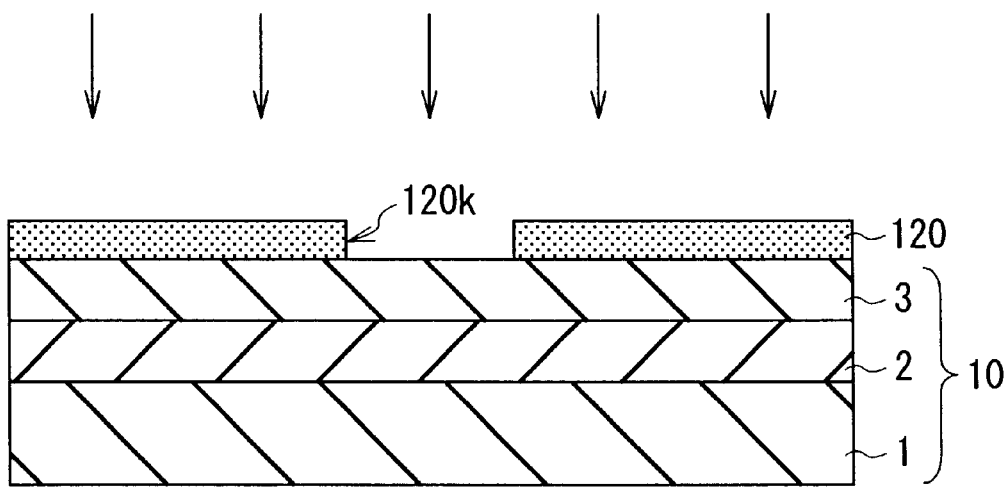
FIG. 20 is a cross sectional view for describing a step of a method of manufacturing the memory device according to the sixth embodiment of the invention.

The memory device is manufactured through the following steps, for example. Of the steps of manufacturing the memory device, the step of forming the insulating film 3 and the preceding steps are the same as the corresponding steps of the above-described first embodiment (see FIG. 2), and thus the description thereof is omitted. After forming the insulating film 3 through the above-mentioned steps, for example, a photoresist film is formed on the insulating film 3. Then, the photoresist film is patterned by use of, for example, high-accuracy photolithography, and thus a mask 120 having an opening 120k with a predetermined shape is formed on the insulating film 3 as shown in FIG. 20. The opening 120k is shaped so as to correspond to a planar shape of the first control electrode 11H to be formed.

Figure 21:
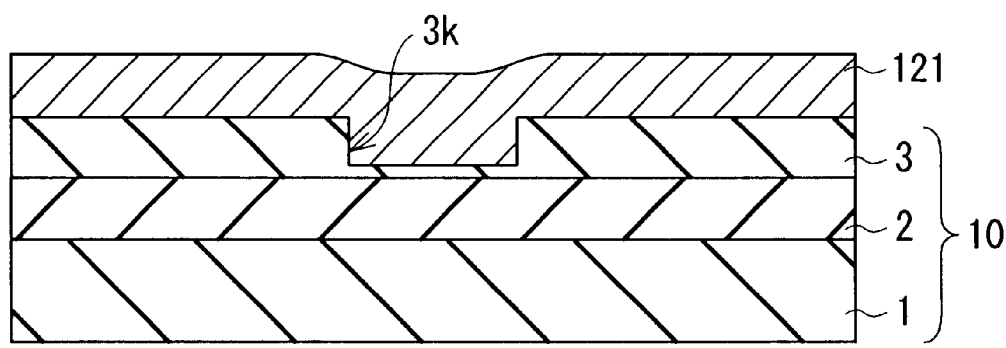
FIG. 21 is a cross sectional view for describing a step following the step of FIG. 20.

Then, the overall surface is subjected to etching using a mixed gas of carbon tetrafluoride ($CF_4$) and hydrogen ($H_2$), using the mask 120, for example. As shown in FIG. 21, this etching process selectively removes a region of the insulating film 3 corresponding to the opening 120k, thereby forming the concave portion (a recess) 3k in and near the surface of the insulating film 3. For example, the etching process takes place in such a manner that a depth of the concave portion 3k is approximately equal to a thickness of the first control electrode 11H to be formed (e.g., about 100 nm). The mask 120 itself is also etched by the above-mentioned etching process, so that the mask 120 decreases in thickness. The mask 120 may disappear (see FIG. 21) or remain at the completion of formation of the concave portion 3k. Even if the mask 120 remains, the mask 120 is to be removed by means of polishing in the following step.

Then, an electrode precursor layer 121 made of non-single-crystal silicon (polycrystalline silicon or amorphous silicon) doped with an impurity is formed on the overall surface by means of CVD or sputtering under the condition that a substrate temperature lies between about 600 and 700° C., for instance. For example, the electrode precursor layer 121 is formed in such a manner that at least the concave portion 3k is filled with the electrode precursor layer 121. The electrode precursor layer 121 is to be polished into the first control electrode 11H in the following step. Besides the above-described method, a method in which a metal layer such as tantalum or molybdenum is formed by means of sputtering and then the metal layer is etched and thus patterned, for example, may be used as a method of forming the electrode precursor layer 121.

Figure 22:
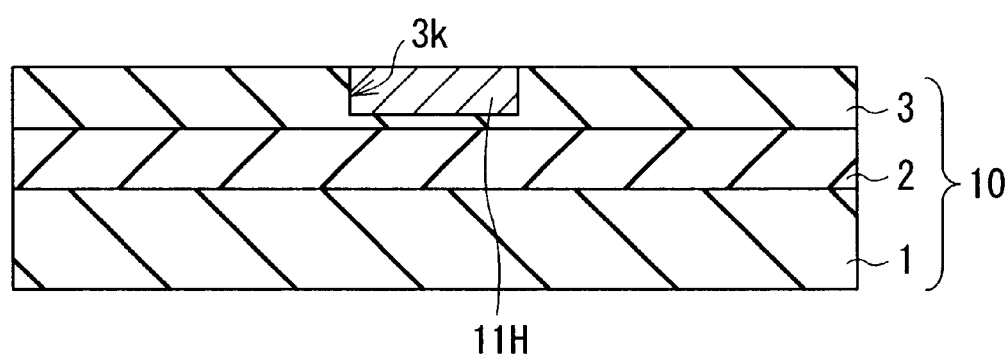
FIG. 22 is a cross sectional view for describing a step following the step of FIG. 21.

Then, the overall surface is polished by means of, for example, CMP (chemical mechanical polishing). For instance, this polishing takes place until the insulating film 3 is exposed. By this polishing, the first control electrode 11H is formed in such a manner that the concave portion 3k is filled with the first control electrode 11H, as shown in FIG. 22.

The steps following the step of forming the first control electrode 11H are the same as, for example, the steps following the step of forming the first control electrode 11 of the above-described fifth embodiment, which have been described with reference to the drawings following FIG. 15, and thus the description thereof is omitted.

Advantages, modifications and the like of the memory device according to the sixth embodiment are the same as those of the memory devices according to the above-described first to fifth embodiments. The structure of and around the first control electrode 11H of the sixth embodiment (i.e., the structure in which the first control electrode 11H is provided so as to be filled into the concave portion 3k provided in the insulating film 3) and the method of forming the structure may be, of course, applied to the above-described embodiments, exclusive of the fifth embodiment.

Seventh Embodiment

Next, a memory device according to a seventh embodiment of the invention will be described with reference to FIG. 23.

The memory device according to the seventh embodiment has the same main structure as the memory device according to the above-described first embodiment has (see FIG. 1), except that a first control electrode 11L made of a continuous film having two-dimensional space is formed without performing isolation for forming the first control electrode 11 of the above-described first embodiment, for example. In FIG. 23, the same components as the components of the above-described first embodiment are indicated by the same reference numerals, and the detailed description of the same components is appropriately omitted.

Figure 23:
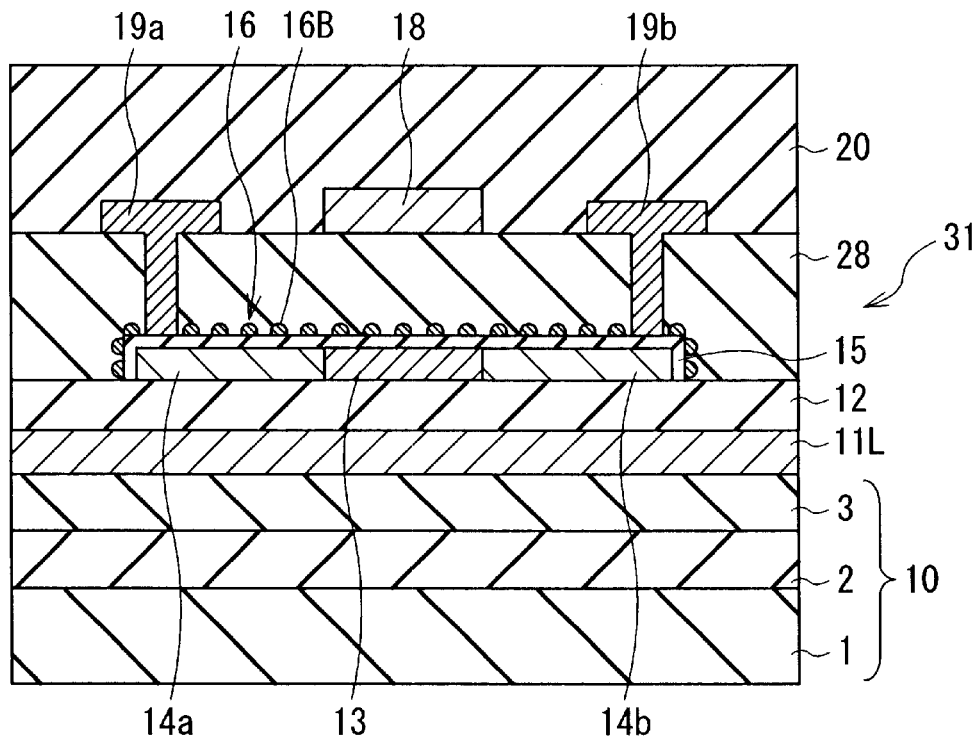
FIG. 23 is a cross sectional view for describing a configuration of a memory device according to a seventh embodiment of the invention.

In the memory device, the first control electrode 11L made of the continuous film having two-dimensional space is provided on the underlayer portion 10 (the insulating film 3), as shown in FIG. 23, for example. For instance, the first control electrode 11L functions as "a first control electrode" for not only one memory transistor 31 but also a plurality of other memory transistors and the like (not shown) similarly formed on the underlayer portion 10, and the first control electrode 11L is shared by a plurality of electronic devices such as memory transistors.

In the memory device, an electric potential is applied to only the second control electrode 18 as in the case of, for example, a conventional EEPROM, and thus "the reading of data" is performed. The functions for performing "the writing of data", "the holding of data" and "the erasing of data" are the same as the functions for performing "the writing of data" and the like of the above-described first embodiment, for example.

In the memory device according to the seventh embodiment, the first control electrode 11L is shared by a plurality of electronic devices including the memory transistor 31, so that it becomes unnecessary to form the first control electrode for each device, and therefore the number of steps of forming the electrode decreases. This facilitates the step of manufacturing for forming a plurality of electronic devices including the memory transistor 31 on the underlayer portion 10. It should be noted that written data may be inaccurately read out due to the above-mentioned change in the amount of electric current between the conduction region 13 and the storage region 16, because the memory device performs "the reading of data" by applying an electric potential to only the second control electrode 18 as described above.

A method of manufacturing the memory device according to the seventh embodiment and advantages and the like of the memory device, except for the above-mentioned advantage and the like, are the same as those of the memory device according to the above-described first embodiment. The configuration of the first control electrode 11L of the seventh embodiment may be applied to the second to fifth embodiments.

Eighth Embodiment

Next, a memory device according to an eighth embodiment of the invention will be described with reference to FIG. 24.

The memory device according to the eighth embodiment has the same main structure as the memory device according to the above-described third embodiment has (see FIG. 7), except that a second control electrode 46L made of a continuous film having two-dimensional space is formed without performing isolation for forming the second control electrode 46 of the above-described third embodiment, for example. In FIG. 24, the same components as the components of the above-described third embodiment are indicated by the same reference numerals, and the detailed description of the same components is appropriately omitted.

Figure 24:
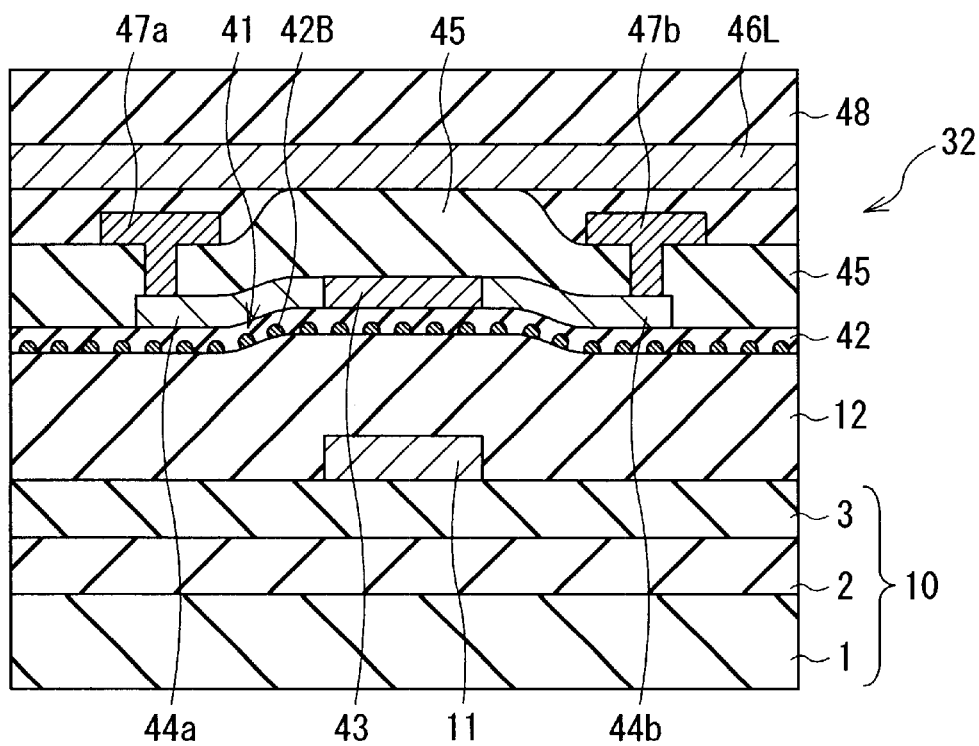
FIG. 24 is a cross sectional view for describing a configuration of a memory device according to an eighth embodiment of the invention.

In the memory device, the second control electrode 46L made of the continuous film having two-dimensional space is provided on the second control insulating film 45, as shown in FIG. 24, for example. For instance, the second control electrode 46L functions as "a second control electrode" for not only one memory transistor 32 but also a plurality of other memory transistors and the like (not shown) similarly formed on the underlayer portion 10, and the second control electrode 46L is shared by a plurality of electronic devices such as memory transistors.

In the memory device, a predetermined electric potential is applied to only the first control electrode 11 as in the case of, for example, a conventional EEPROM, and thus "the reading of data" is performed. The functions for performing "the writing of data", "the holding of data" and "the erasing of data" are the same as the functions for performing "the writing of data" and the like of the above-described third embodiment, for example.

In the memory device according to the eighth embodiment, the advantage of the configuration of the second control electrode 46L is the same as the advantage of the first control electrode 11L of the above-described seventh embodiment. That is, the second control electrode 46L is shared by a plurality of electronic devices, so that the manufacturing of a plurality of electronic devices can be facilitated.

A method of manufacturing the memory device according to the eighth embodiment and advantages and the like of the memory device, except for the above-mentioned advantage and the like, are the same as those of the memory device according to the above-described third embodiment. The configuration of the second control electrode 46L of the eighth embodiment may be applied to the first, second, fourth or fifth embodiment.

Ninth Embodiment

Figure 25:
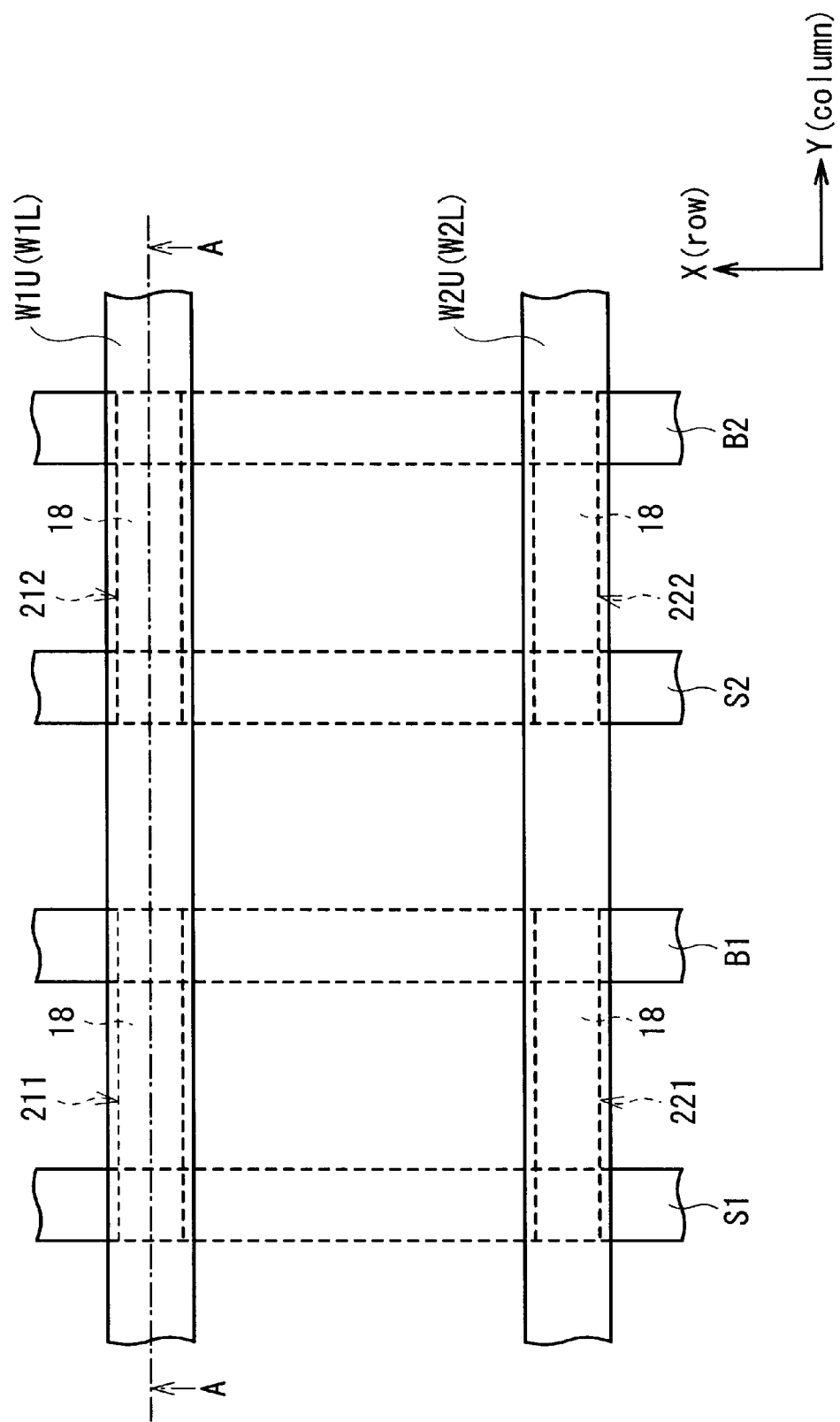
FIG. 25 is a plan view for describing a configuration of an integrated circuit according to a ninth embodiment of the invention.
Figure 26:
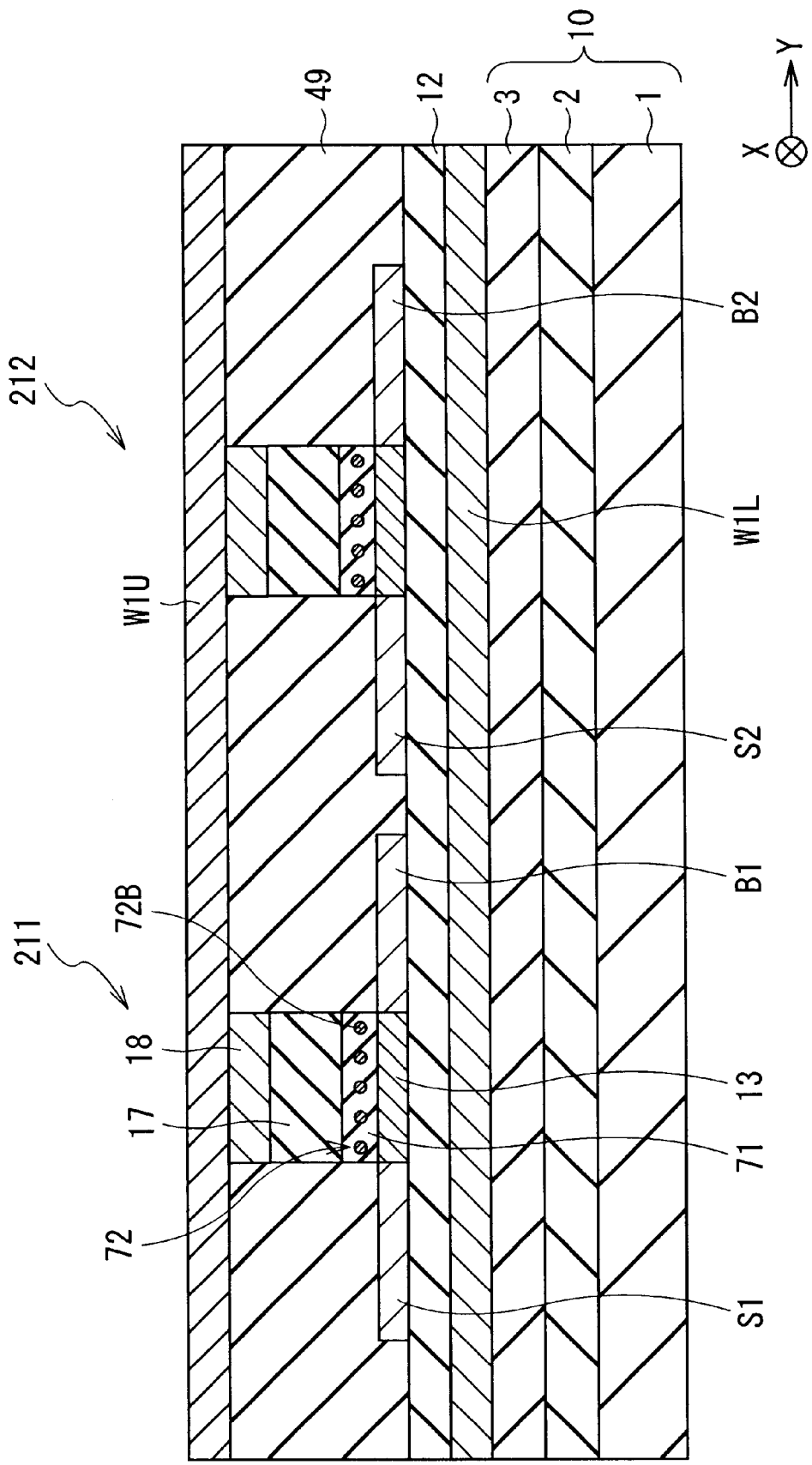
FIG. 26 is a cross sectional view of the integrated circuit shown in FIG. 25, taken along the line A—A of FIG. 25.

Next, an example of integration of memory devices will be described with reference to FIGS. 25 to 27. A series of the above-described memory devices can be integrated and used in the following manner, for example. Hereinafter, for instance, it is assumed that a plurality of memory devices each having the same structure as the structure of the memory device of the above-described fifth embodiment (see FIG. 14) are integrated. Of the directions of arrangement of the memory devices, the X-axis direction and the Y-axis direction in FIGS. 25 to 27 are expressed as "a row (or a row direction)" and "a column (or a column direction)", respectively. In FIGS. 25 to 27, the same components as the components of the above-described fifth embodiment are indicated by the same reference numerals, and the detailed description of the same components is appropriately omitted.

FIG. 25 shows a planar structure of an integrated circuit on which memory devices are integrated, and FIG. 26 shows a sectional structure viewed in the direction of the arrows along the line A—A of FIG. 25. FIG. 27 shows a circuit configuration of the integrated circuit shown in FIG. 25. The integrated circuit comprises a matrix of a plurality of memory devices 211, 212, 221 and 222. Although only four memory devices, for example, are shown in FIGS. 25 and 27, a plurality of memory devices (not shown), as well as these four memory devices, are arranged in matrix form.

An upper word line W1U extends in, for example, "the column direction" on the second control electrode 18 of the memory device 211. A lower word line W1L having the same function as the function of the first control electrode 11 extends in "the column direction" in a region of the memory device 211 in which the first control electrode 11 is provided in the case of the above-described fifth embodiment. A plurality of other memory devices (the memory device 212 and so on), which are provided in the same "column" as the column of the memory device 211, are also provided with the upper word line W1U and the lower word line W1L in between.

A source line S1 having the same functions as the functions of both the first impurity region 14a and the source electrode 19a is provided in a region of the memory device 211 in which the first impurity region 14a is provided in the case of the above-described fifth embodiment, and a bit line B1 having the same functions as the functions of both the second impurity region 14b and the drain electrode 19b is provided in a region of the memory device 211 in which the second impurity region 14b is provided in the case of the above-described fifth embodiment. Both the source line S1 and the bit line B1 extend in, for example, "the row direction", and a plurality of other memory devices (the memory device 221 and so on), which are provided in the same "row" as the row of the memory device 211, are also provided with the source line S1 and the bit line B1 in between.

The respective materials of the word lines (including the upper word line and the lower word line), the source line and the bit line and a method of forming these lines are the same as those of the second control electrode 18, for example.

A plurality of other memory devices (the memory device 222 and so on), which are provided in the same "column" as the column of the memory device 221, are provided with an upper word line W2U and a lower word line W2L in between, as in the case of the above-mentioned memory device 211 and so on. A plurality of other memory devices (the memory device 222 and so on), which are provided in the same "row" as the row of the memory device 212, are provided with a source line S2 and a bit line B2 in between, as in the case of the above-mentioned memory device 211.

The integrated circuit having the above-described configuration functions in the following manner. Hereinafter, for example, it is assumed that each of the memory devices constituting the integrated circuit has an n-channel type structure, and the description is given with regard to a series of functions (the writing, holding, erasing and reading of data) of the memory device 211, which is typical of a plurality of memory devices.

In the integrated circuit, for example, in a state in which the electric potentials of all word lines other than the upper word line W1U (i.e., the upper word line W2U, the lower word lines W1L and W2L, and so on) and the source line S1 are at 0 V, a positive electric potential E9 (e.g., E9=+5 V) is applied to the bit line B1, and a positive electric potential E10 (e.g., E10=+10 V) is applied to the upper word line W1U, whereby "the writing of data" is performed. To perform the above-mentioned "writing of data", for example, an electric potential (e.g., E10/2=+5 V), which is almost one-half the electric potential E10 applied to the upper word line W1U, is applied to all source lines other than the source line S1 (i.e., the source line S2 and so on) and all bit lines other than the bit line B1 (i.e., the bit line B2 and so on). This allows avoiding the occurrence of a malfunction (e.g., "the writing of data" or the like) of memory devices other than the memory device 211 resulting from a change in an electric potential at the time of "the writing of data".

For example, the electric potentials of all the lines (the upper word lines W1U and W2U, the lower word lines W1L, W2L, etc., the source lines S1 and S2, and the bit lines B1, B2, etc.) are made equal, or the electric potentials thereof are made floating (e.g., 0 V), whereby written data is held.

For example, in a state in which the electric potentials of all word lines other than the upper word line W1U (i.e., the upper word line W2U, the lower word lines W1L and W2L, and so on) and the source line S1 are at 0 V, a negative electric potential E11 (e.g., E11=−5 V) is applied to the bit line B1, and a negative electric potential E12 (e.g., E12=−10 V) is applied to the upper word line W1U, whereby "the erasing of data" is performed. To perform the above-mentioned "erasing of data", for example, an electric potential (e.g., E12/2=−5 V), which is almost one-half the electric potential E12 applied to the upper word line W1U, is applied to all source lines other than the source line S1 (i.e., the source line S2 and so on) and all bit lines other than the bit line B1 (i.e., the bit line B2 and so on). This allows avoiding the occurrence of a malfunction (e.g., "the erasing of data" or the like) of memory devices other than the memory device 211 resulting from a change in an electric potential at the time of "the erasing of data".

For example, in a state in which the electric potentials of all bit lines other than the bit line B1 (i.e., the bit line B2 and so on), all word lines other than the lower word line W1L (i.e., the upper word lines W1U and W2U and the lower word line W2L) and all the source lines (S1 and S2) are at 0 V, a positive electric potential E13 (e.g., E13=+5 V) is applied to the bit line B1, a positive electric potential E14 (e.g., E14=+5 V) is applied to the lower word line W1L, and the amount of electric current passing through the bit line B1 is measured, whereby "the reading of data" is performed.

In memory devices other than the memory device 211 (e.g., the memory devices 212, 221, 222, etc.), predetermined electric potentials are applied to a word line, a source line and a bit line for a specific memory device as in the case of the above-mentioned memory device 211, whereby a series of functions (the writing of data and so forth) is executed. When each of the memory devices constituting the integrated circuit has a p-channel type structure, a series of functions is executed in the same manner by the application of electric potentials of signs opposite to the signs of the above-mentioned electric potentials (E10 to E14). Of course, the memory device for use in "integration of memory devices" according to a ninth embodiment is not limited to the memory device according to the above-described fifth embodiment, and the memory device according to any one of the other embodiments may be used.

Tenth Embodiment

Figure 28:
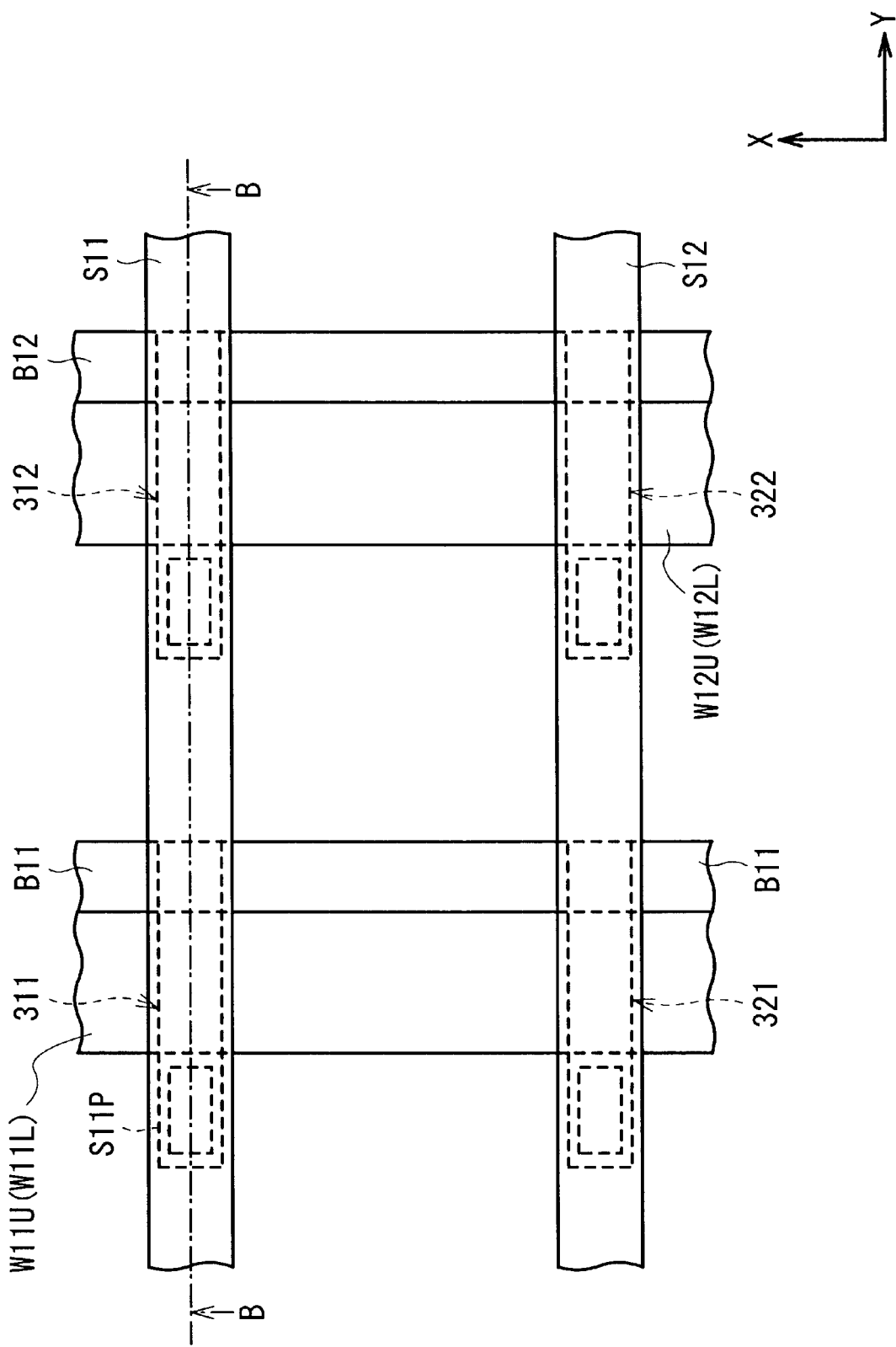
FIG. 28 is a plan view for describing a configuration of an integrated circuit according to a tenth embodiment of the invention.
Figure 29:
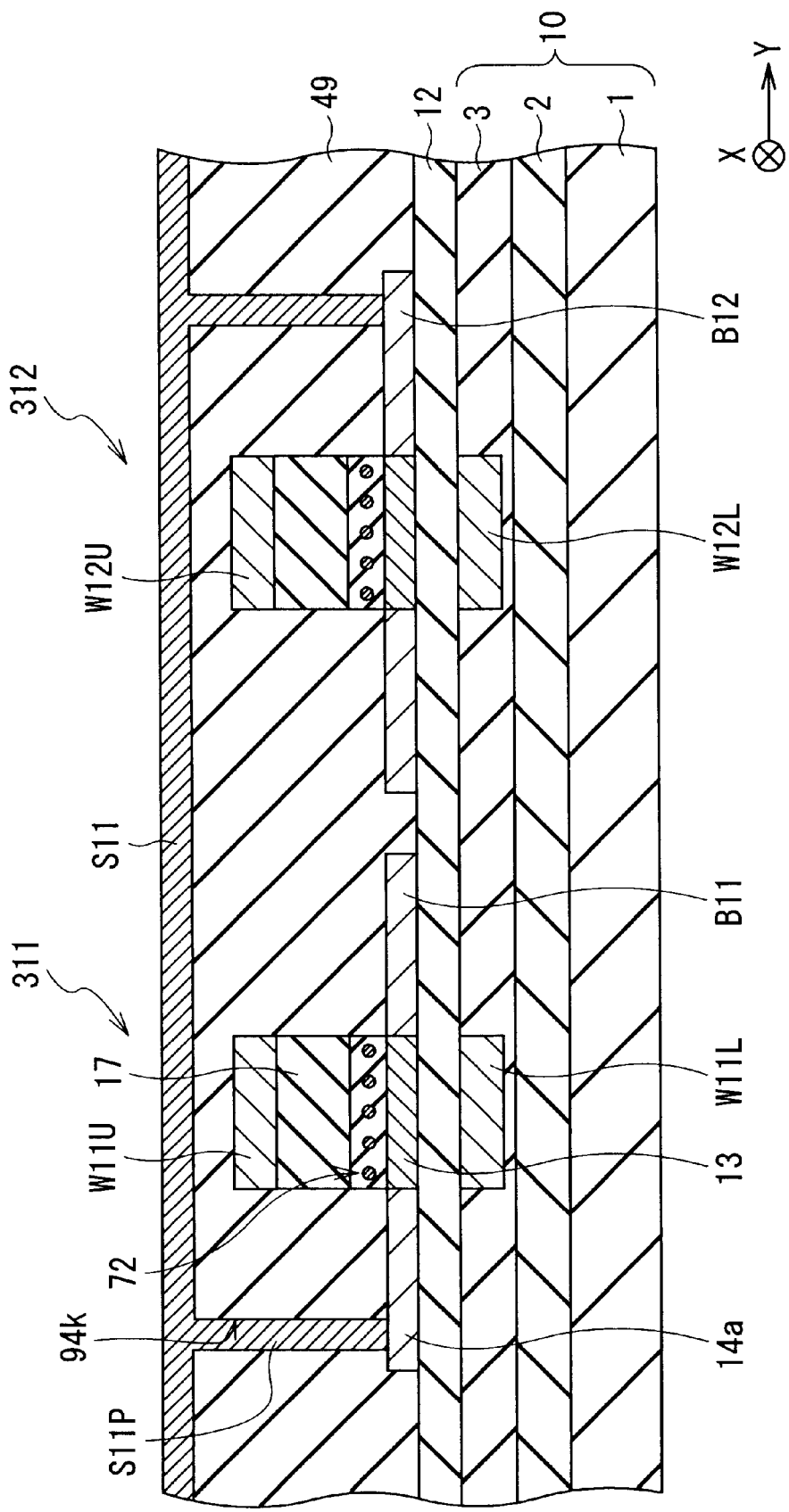
FIG. 29 is a cross sectional view of the integrated circuit shown in FIG. 28, taken along the line B—B of FIG. 28.
Figure 30:
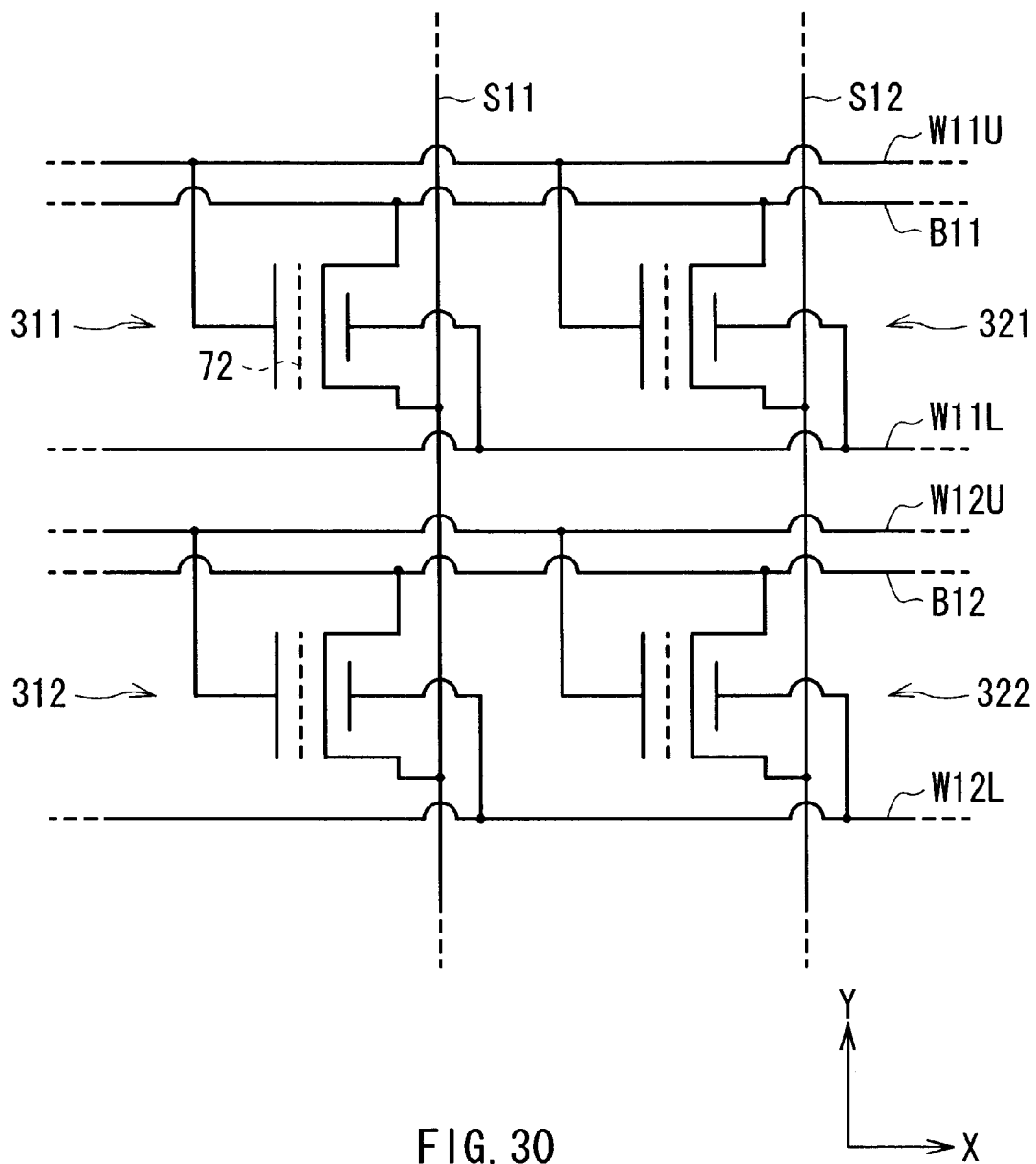
FIG. 30 is a circuit diagram for describing a circuit configuration of the integrated circuit shown in FIG. 28.

Next, another example of integration of memory devices will be described with reference to FIGS. 28 to 30. Hereinafter, for instance, it is assumed that a plurality of memory devices each having the same structure as the structure of the memory device of the above-described sixth embodiment (see FIG. 19) are integrated. In FIGS. 28 to 30, the same components as the components of the above-described sixth embodiment are indicated by the same reference numerals, and the detailed description of the same components is appropriately omitted.

FIG. 28 shows a planar structure of an integrated circuit on which memory devices are integrated, and FIG. 29 shows a sectional structure viewed in the direction of the arrows along the line B—B of FIG. 28. FIG. 30 shows a circuit configuration of the integrated circuit shown in FIG. 28. The integrated circuit comprises a matrix of a plurality of memory devices 311, 312, 321 and 322. Although not shown in FIGS. 28 to 30, a plurality of memory devices (not shown), as well as these four memory devices, are arranged in the same manner in the row direction and the column direction.

A lower word line W11L having the same function as the function of the first control electrode 11H is provided in a region of the memory device 311 in which the first control electrode 11H is provided in the case of the above-described sixth embodiment, and an upper word line W11U having the same function as the function of the second control electrode 18 is provided in a region of the memory device 311 in which the second control electrode 18 is provided in the case of the above-described sixth embodiment. A bit line B11 having the same function as the function of the second impurity region 14b is provided in a region of the memory device 311 in which the second impurity region 14b is provided in the case of the above-described sixth embodiment. The lower word line W11L, the upper word line W11U and the bit line B11 extend in, for example, "the row direction", and a plurality of other memory devices (the memory device 321 and so on), which are provided in the same "row" as the row of the memory device 311, are also provided with the lower word line W11L, the upper word line W11U and the bit line B11 in between.

A source line S11 extending in, for example, "the column direction" is provided on the third control insulating film 49. A connect portion S11P forming a part of the source line S11 is in contact with and electrically connected to the first impurity region 14a via an opening formed by selectively removing a part of the third control insulating film 49. The source line S11 has the same function as the function of the source electrode 19a of the above-described sixth embodiment (see FIG. 19). A plurality of other memory devices (the memory device 312 and so on), which are provided in the same "column" as the column of the memory device 311, are also provided with the source line S11 (the connect portion S11P) in between.

A plurality of other memory devices (the memory device 322 and so on), which are provided in the same "row" as the row of the memory device 312, are also provided with a lower word line W12L, an upper word line W12U and a bit line B12 in between, as in the case of the above-mentioned memory device 311 and so forth. A plurality of other memory devices (the memory device 322 and so on), which are provided in the same "column" as the column of the memory device 321, are also provided with a source line S12 in between, as in the case of the above-mentioned memory device 311.

In the memory device having the above-described configuration, the writing, holding, erasing and reading of data are performed on a specific memory device by the same functions as the functions of the integrated circuit of the above-described ninth embodiment. Of course, the memory device for use in "integration of memory devices" according to a tenth embodiment is not limited to the memory device according to the sixth embodiment, and the memory device according to any one of the other embodiments may be used.

Eleventh Embodiment

Figure 31:
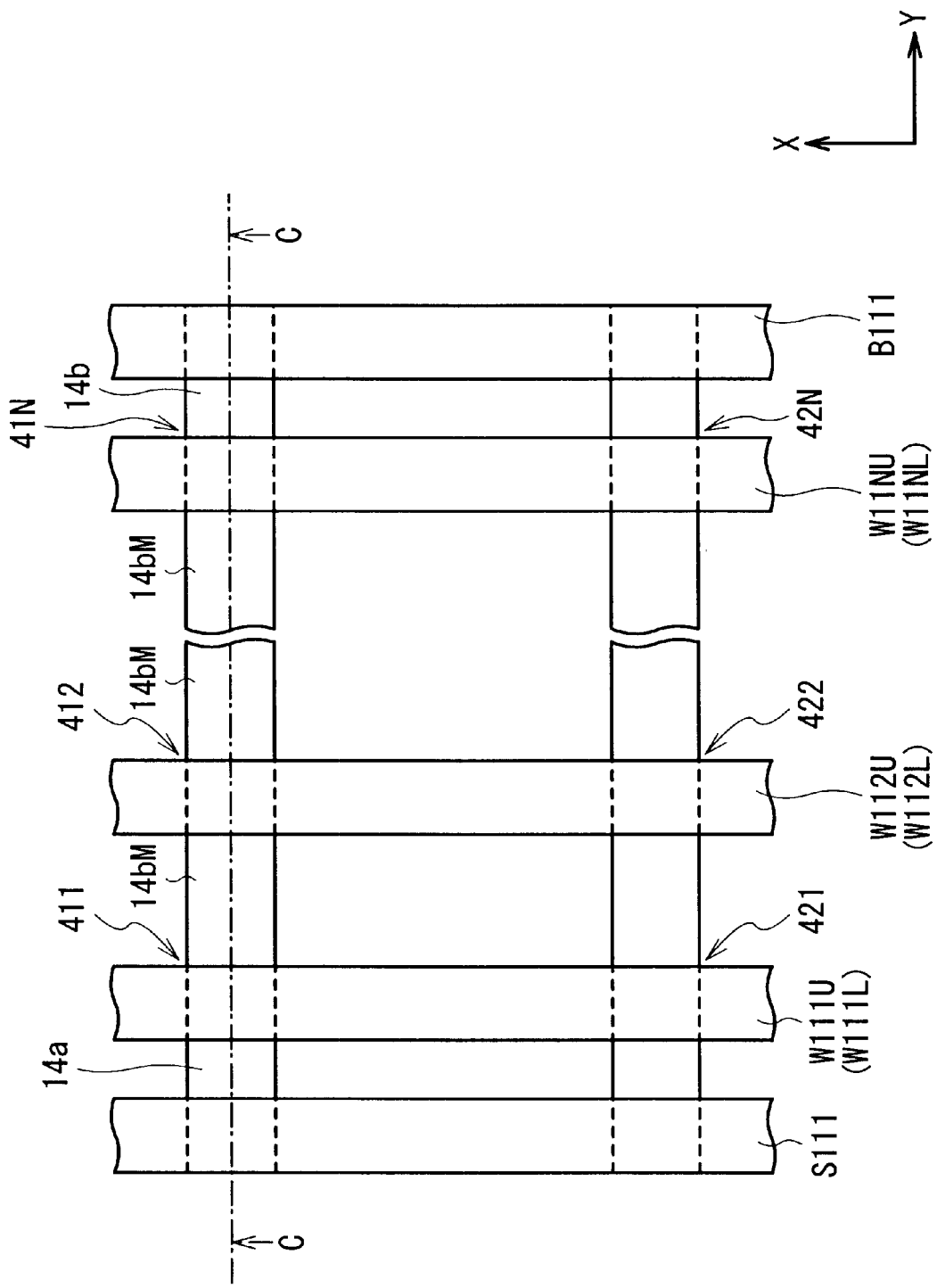
FIG. 31 is a plan view for describing a configuration of an integrated circuit according to an eleventh embodiment of the invention.
Figure 32:
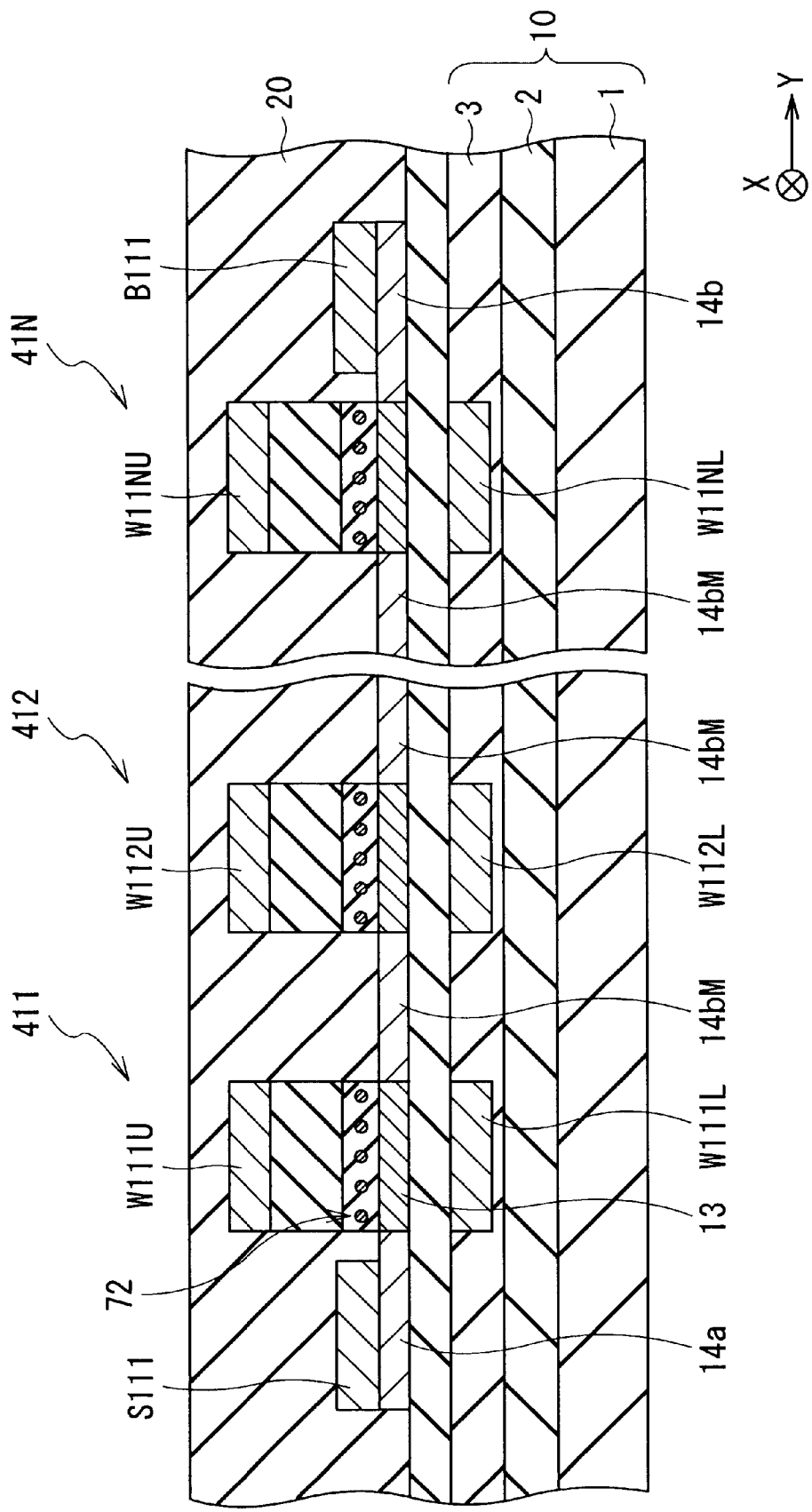
FIG. 32 is a cross sectional view of the integrated circuit shown in FIG. 31, taken along the line C—C of FIG. 31.
Figure 33:
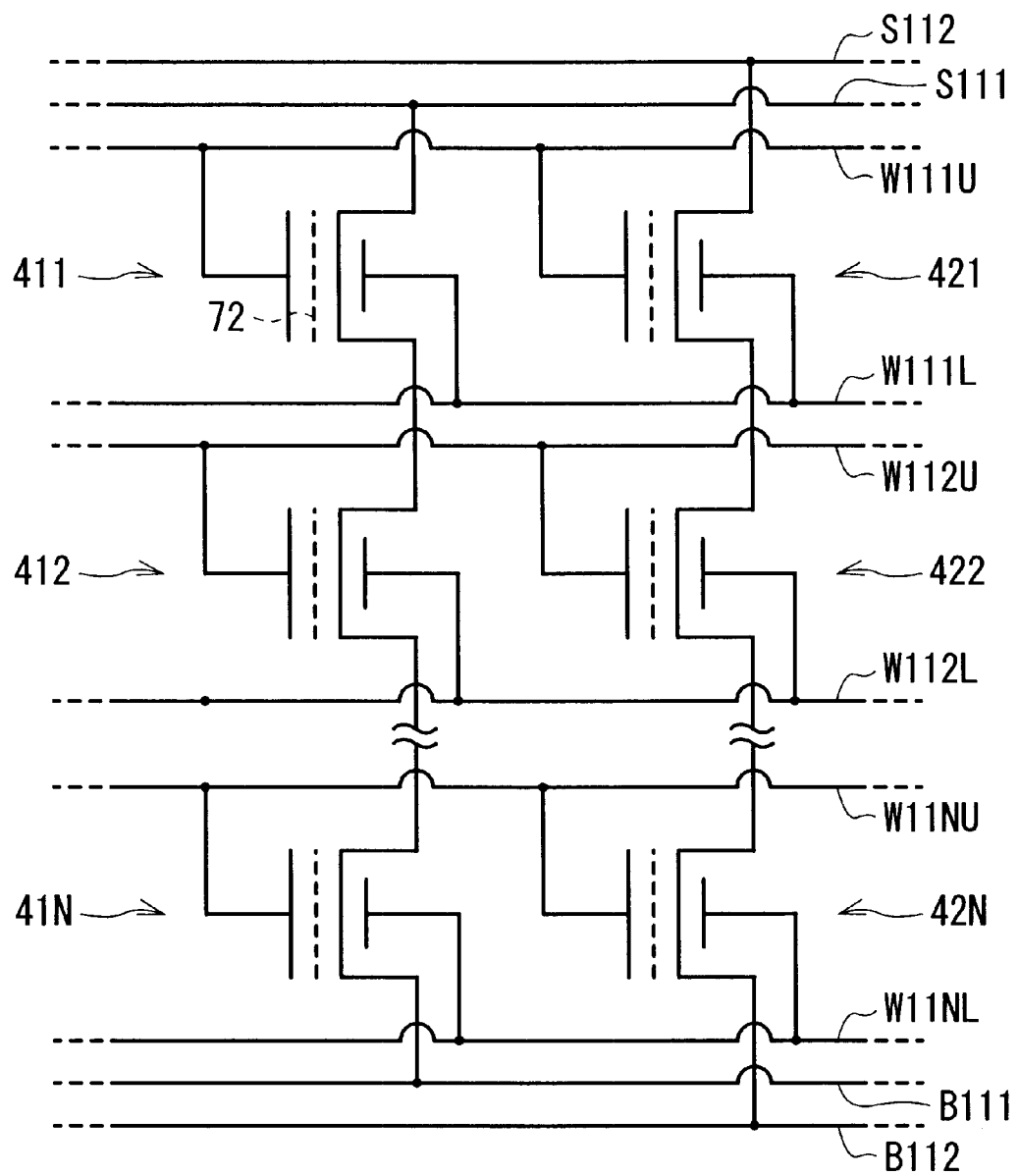
FIG. 33 is a circuit diagram for describing a circuit configuration of the integrated circuit shown in FIG. 31.

Next, still another example of integration of memory devices will be described with reference to FIGS. 31 to 33. Hereinafter, for instance, it is assumed that a plurality of memory devices each having the same structure as the structure of the memory device of the above-described sixth embodiment are integrated. In FIGS. 31 to 33, the same components as the components of the above-described sixth embodiment are indicated by the same reference numerals, and the detailed description of the same components is appropriately omitted.

FIG. 31 shows a planar structure of an integrated circuit on which a plurality of memory devices are integrated, and FIG. 32 shows a sectional structure viewed in the direction of the arrows along the line C—C of FIG. 31. FIG. 33 shows a circuit configuration of the integrated circuit shown in FIG. 31. The integrated circuit comprises a matrix of plural (e.g., N) memory devices 411, 412, . . . , 41N and 421, 422, . . . , 42N.

A lower word line W111L is provided in a region of the memory device 411 in which the first control electrode 11H is provided in the case of the above-described sixth embodiment (see FIG. 19), and an upper word line W111U is provided in a region of the memory device 411 in which the second control electrode 18 is provided in the case of the above-described sixth embodiment. Both the lower word line W111L and the upper word line W111U extend in, for example, "the row direction", and a plurality of memory devices (the memory device 421 and so on), which are provided in the same "row" as the row of the memory device 411, are also provided with the lower word line W111L and the upper word line W111U in between. A plurality of other memory devices (412 to 41N, etc.), which are provided in the same "column" as the column of the memory device 411, are also provided with each of lower word lines (W112L to W11NL) and each of upper word lines (W112U to W11NU) in between, as in the case of the memory device 411.

A middle region 14bM having the same function as the function of the second impurity region 14b is provided in a region of the memory device 411 in which the second impurity region 14b is provided in the case of the above-described sixth embodiment. The middle region 14bM functions as "a drain region" for the memory device 411 and also functions as "a source region" for the memory device 412 located next to the memory device 411. That is, the middle region 14bM is shared by the memory devices 411 and 412 so as to serve as one of the respective structural parts of the memory devices 411 and 412. As mentioned above, neighboring memory devices are provided with the middle region 14bM in between, as in the case of the memory devices 411 and 412.

A source line S111 is provided on the first impurity region 14a of one of a plurality of memory devices (e.g., the memory devices 411 to 41N) aligned in the same "column", specifically, the memory device (e.g., the memory device 411) located on one end of the column. The source line S111 has the same function as the source electrode 19a of the above-described sixth embodiment (see FIG. 19) has. On the other hand, a bit line B111 is provided on the second impurity region 14b of the memory device (e.g., the memory device 41N) located on the other end of the column. The bit line B111 has the same function as the drain electrode 19b of the above-described sixth embodiment (see FIG. 19) has. Both the source line S111 and the bit line B111 extend in the "row" direction, for example. As shown in FIG. 33, a plurality of memory devices, e.g., the memory devices 421 to 42N, which are aligned in a different "column" from the "column" in which the memory devices 411 to 41N are aligned, are also provided with a source line S112 and a bit line B112 in between.

The integrated circuit having the above-described configuration functions in the following manner. Hereinafter, for example, it is assumed that each of the memory devices constituting the integrated circuit has an n-channel type structure, and the description is given with regard to a series of functions (the writing, holding, erasing and reading of data) of the memory device 411, which is typical of a plurality of memory devices.

In the integrated circuit, for example, in a state in which the electric potentials of the source line S111, the bit line B111 and all the lower word lines W112L to W11NL other than the lower word line W111L are at 0 V, an electric potential E20 (e.g., E20=+5 V) is applied to the lower word line W111L and all the upper word lines (W112U to W11NU) other than the upper word line W111U, a positive electric potential E21 (e.g., E21=+10 V) is applied to the upper word line W111U, and an electric potential (e.g., E21/2=+5 V), which is almost one-half the electric potential E21 applied to the upper word line W111U, is applied to all the source lines (S112, etc.) other than the source line S111 and all the bit lines (B112, etc.) other than the bit line B111, whereby "the writing of data" is performed.

For example, the electric potentials of all the word lines (including the upper word lines and the lower word lines), the source lines and the bit lines are made equal, or the electric potentials thereof are made floating (e.g., 0 V), whereby written data is held.

For example, in a state in which the electric potentials of the source line S111, the bit line B111 and all the lower word lines W111L to W11NL are at 0 V, a negative electric potential E22 (e.g., E22=−10 V) is applied to the upper word line W111U, and an electric potential (e.g., E22/2=−5 V), which is almost one-half the electric potential E22 applied to the upper word line W111U, is applied to all the source lines (S112, etc.) other than the source line S111 and all the bit lines (B112, etc.) other than the bit line B111, whereby "the erasing of data" is performed.

For example, in a state in which the electric potentials of the upper word line W111U, all the source lines (S111, S112, etc.) and all the bit lines (B112, etc.) other than the bit line B111 are at 0 V, a positive electric potential E23 (e.g., E23=+5 V) is applied to the bit line B111, a positive electric potential E24 (e.g., E24=+5 V) is applied to all the lower word lines (W112L to W11NL) other than the lower word line W111L, and the amount of electric current passing through the bit line B111 is measured, whereby "the reading of data" is performed.

When each of the memory devices constituting the integrated circuit has a p-channel type structure, a series of functions is executed in the same manner by the application of electric potentials of signs opposite to the signs of the above-mentioned electric potentials (E20 to E24). Of course, the memory device for use in "integration of memory devices" according to an eleventh embodiment is not limited to the memory device according to the above-described sixth embodiment, and the memory device according to any one of the other embodiments may be used.

Twelfth Embodiment

Figure 34:
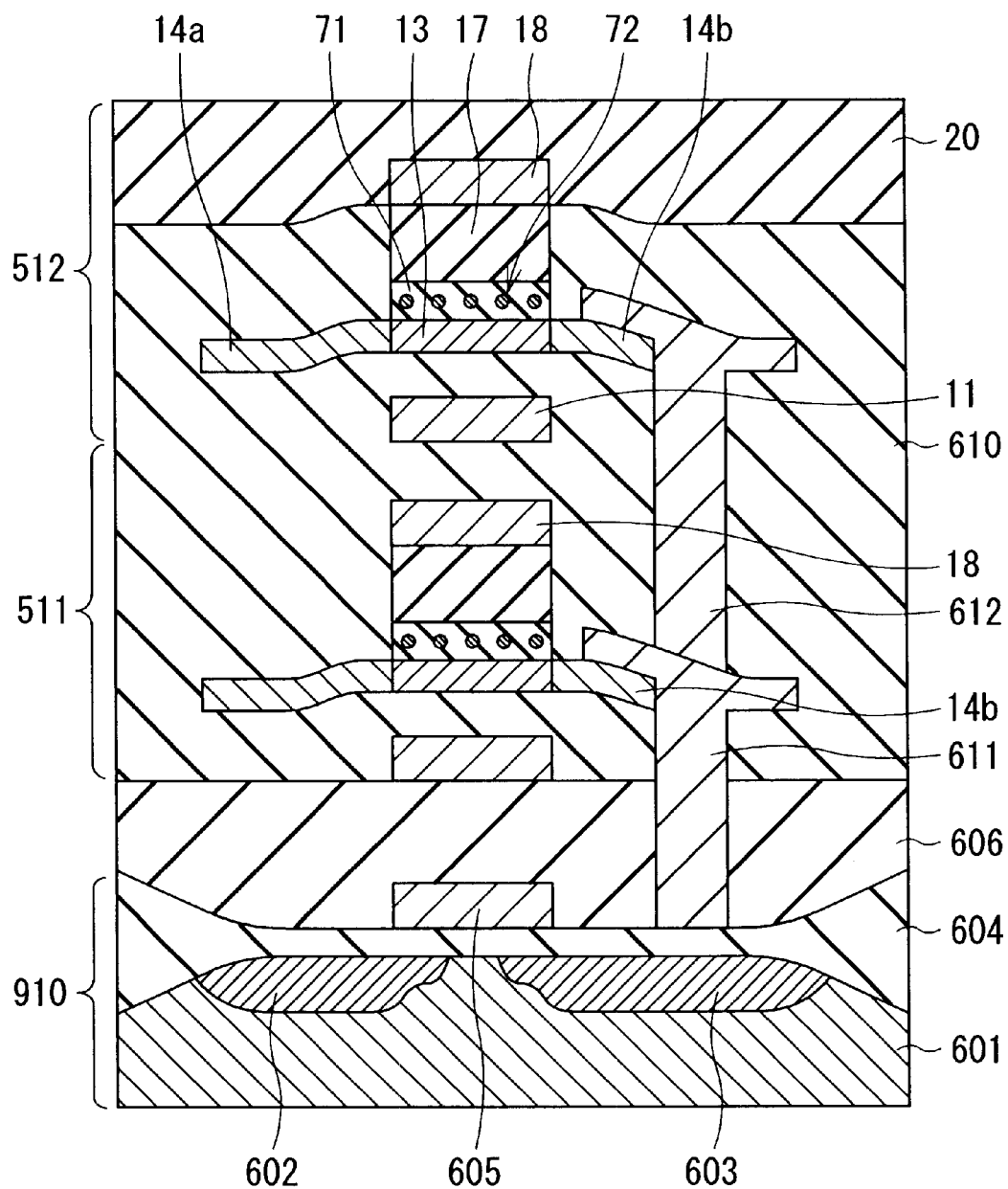
FIG. 34 is a cross sectional view for describing a configuration of an integrated circuit according to a twelfth embodiment of the invention.

Next, a further example of integration of memory devices will be described with reference to FIG. 34. For example, an integrated circuit according to a twelfth embodiment comprises a plurality of memory devices, which are integrated into a hierarchically stacked structure. Hereinafter, for instance, it is assumed that a plurality of memory devices each having about the same structure as the structure of the memory device of the above-described fifth embodiment are integrated. In FIG. 34, the same components as the components of the above-described fifth embodiment are indicated by the same reference numerals, and the detailed description of the same components is appropriately omitted.

FIG. 34 shows a sectional structure of an integrated circuit on which memory devices are integrated. The integrated circuit comprises an insulating film 606 provided so as to coat a driving circuit 910, and, for example, two memory devices 511 and 512 that are hierarchically stacked in this sequence on the insulating film 606. As a matter of course, the number of memory devices to be integrated is not necessarily limited to two, and, for example, three or more memory devices may be hierarchically integrated.

The driving circuit 910 is formed of, for example, a MOSFET (a metal oxide semiconductor field effect transistor) and serves to drive the integrated circuit. That is, for example, the driving circuit 910 comprises a semiconductor layer 601 made of a single silicon crystal or the like, a source region 602 and a drain region 603 that are made of silicon or the like containing a predetermined impurity, a gate insulating film 604 made of silicon dioxide or the like, and a gate electrode 605 made of metal such as aluminum, polycrystalline silicon, or the like. The insulating film 606 is made of, for example, silicon dioxide, TEOS (tetraethoxysilane, $Si(OC_2H_5)_4$), SOG (spin on glass) or the like, and serves to provide electrical isolation between the driving circuit 910 and the memory devices 511 and 512. The insulating film 606 has a flattened surface, for example.

The second impurity region 14b of the first-level memory device 511 is connected to the driving circuit 910 through an interlayer wiring 611. The second impurity region 14b of the second-level memory device 512 is connected to the interlayer wiring 611 through an interlayer wiring 612. The interlayer wirings 611 and 612 are made of, for example, a metallic material such as aluminum, copper or tungsten. The respective regions of the memory devices 511 and 512 in which the first control insulating film 12 and the third control insulating film 49 are provided in the case of the above-described fifth embodiment are filled with an interlayer dielectric 610.

In the integrated circuit, an electric potential is applied to the second impurity region 14b of the memory device 511 through the driving circuit 910 and the interlayer wiring 611, and an electric potential is applied to the second impurity region 14b of the memory device 512 through the driving circuit 910 and the interlayer wirings 611 and 612. Functions of each of the memory devices of the integrated circuit are substantially the same as those of the memory device of the above-described fifth embodiment.

The above-described integrated circuit is manufactured through the following steps, for example. That is, first of al, for example, the semiconductor layer 601 made of a single-silicon-crystal substrate or the like is cleaned, and then the semiconductor layer 601 is locally oxidized on and near the surface thereof by means of LOCOS (local oxidation of silicon), whereby the gate insulating film 604 made of silicon dioxide is formed. Then, for example, the gate electrode 605 made of polycrystalline silicon or the like is selectively formed on the gate insulating film 604 by about the same method as the method of forming the first control electrode 11 or the like of the above-described fifth embodiment. Then, for example, an impurity is injected into the semiconductor layer 601 by means of ion implantation using the gate electrode 605 as a mask, and thus the source region 602 and the drain region 603 are selectively formed. Then, for example, the insulating film 606 made of silicon dioxide or the like is formed by means of CVD or sputtering so as to coat the overall surface. Then, for example, the surface of the insulating film 606 is polished and thus flattened by means of CMP. After forming the insulating film 606, the step of forming the memory devices 511 and 512 on the insulating film 606 is substantially the same as the step of forming the memory device of the above-described fifth embodiment, and thus the description thereof is omitted. A method of forming the interlayer wirings 611 and 612 is substantially the same as the method of forming the source electrode 19*a* and the drain electrode 19*b* of the above-described fifth embodiment.

According to the integrated circuit having the above-described configuration, a plurality of memory devices are integrated into the hierarchically stacked structure, so that the number of memory devices which can be integrated per unit area becomes greater than the number of memory devices which can be integrated in a two-dimensional arrangement of a plurality of memory devices. It is therefore possible to increase a storage capacity, as well as reduce an area to be occupied by the integrated circuit. As a matter of course, the memory device for use in "integration of memory devices" according to the twelfth embodiment is not limited to the memory device according to the above-described fifth embodiment, and the memory device according to any one of the other embodiments may be used.

Figure 35:
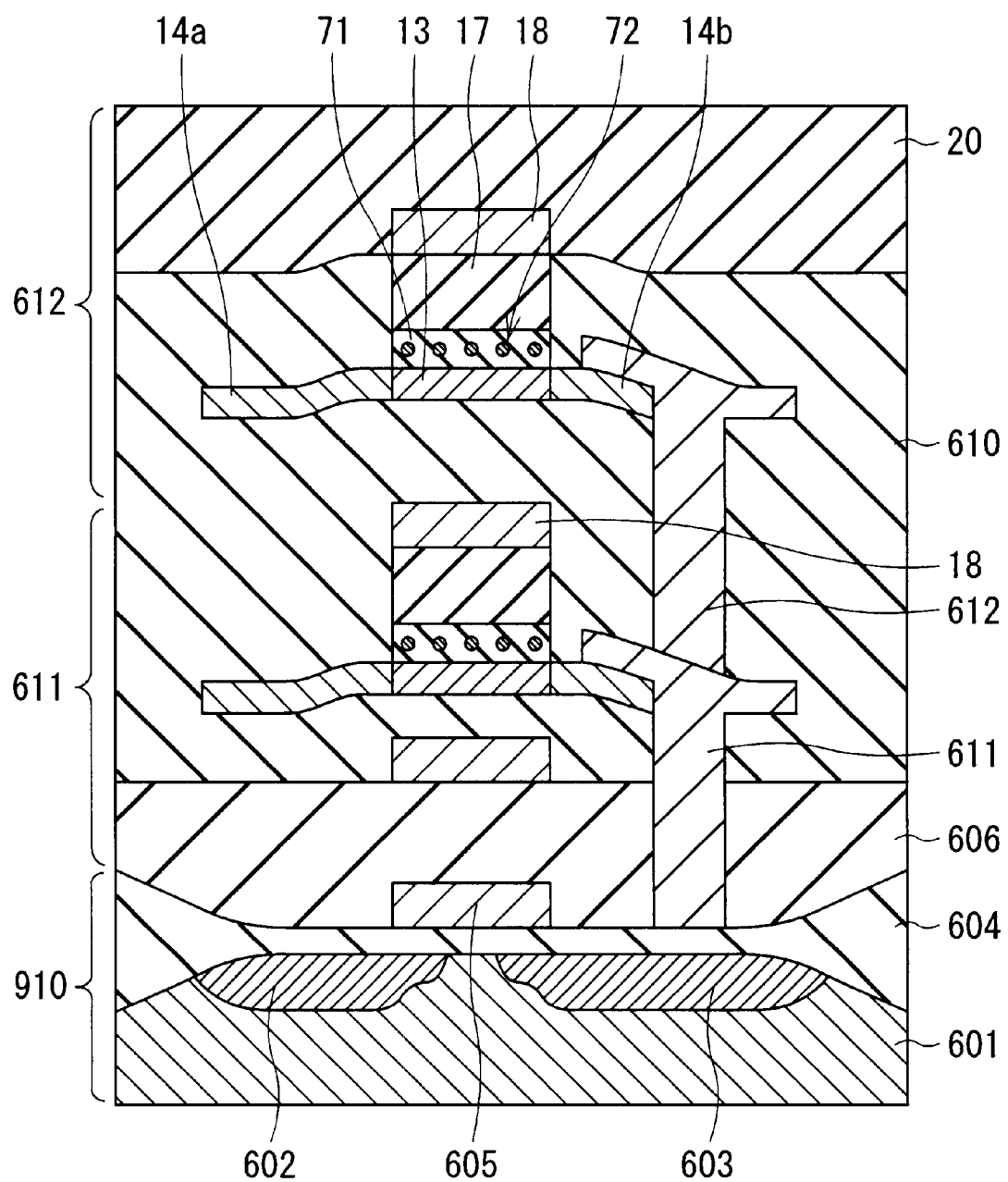
FIG. 35 is a cross sectional view for describing a modification of the integrated circuit according to the twelfth embodiment of the invention.

In the twelfth embodiment, as shown in FIG. 34, two electrodes (the first control electrode 11 and the second control electrode 18) are provided for one memory device in order to drive the memory devices 511 and 512, but the invention is not necessarily limited to this embodiment. For example, as shown in FIG. 35, the first control electrode 11 may be eliminated from the memory device 512 so that the second control electrode 18 of the memory device 511 also functions as "a first control electrode" for the memory device 512. In this case, a thickness of the whole integrated circuit can be reduced by a thickness equivalent to a region of the memory device 512 in which the first control electrode 11 is provided in the case of the integrated circuit shown in FIG. 34. Moreover, a smaller number of first control electrodes 11 to be formed enables not only the lower cost of manufacturing the integrated circuit but also the shorter time required for manufacturing the integrated circuit. Functions of each of the memory devices of the integrated circuit shown in FIG. 35 are substantially the same as those of each memory device of the integrated circuit of the above-described twelfth embodiment. It should be noted that, to drive the memory device 512, an electric potential is applied to the second control electrode 18 of the memory device 511 for functioning as "the first control electrode" for the memory device 512. A structure of the integrated circuit shown in FIG. 35, except for the above-mentioned structure, is the same as that of the integrated circuit shown in FIG. 34.

Figure 36:
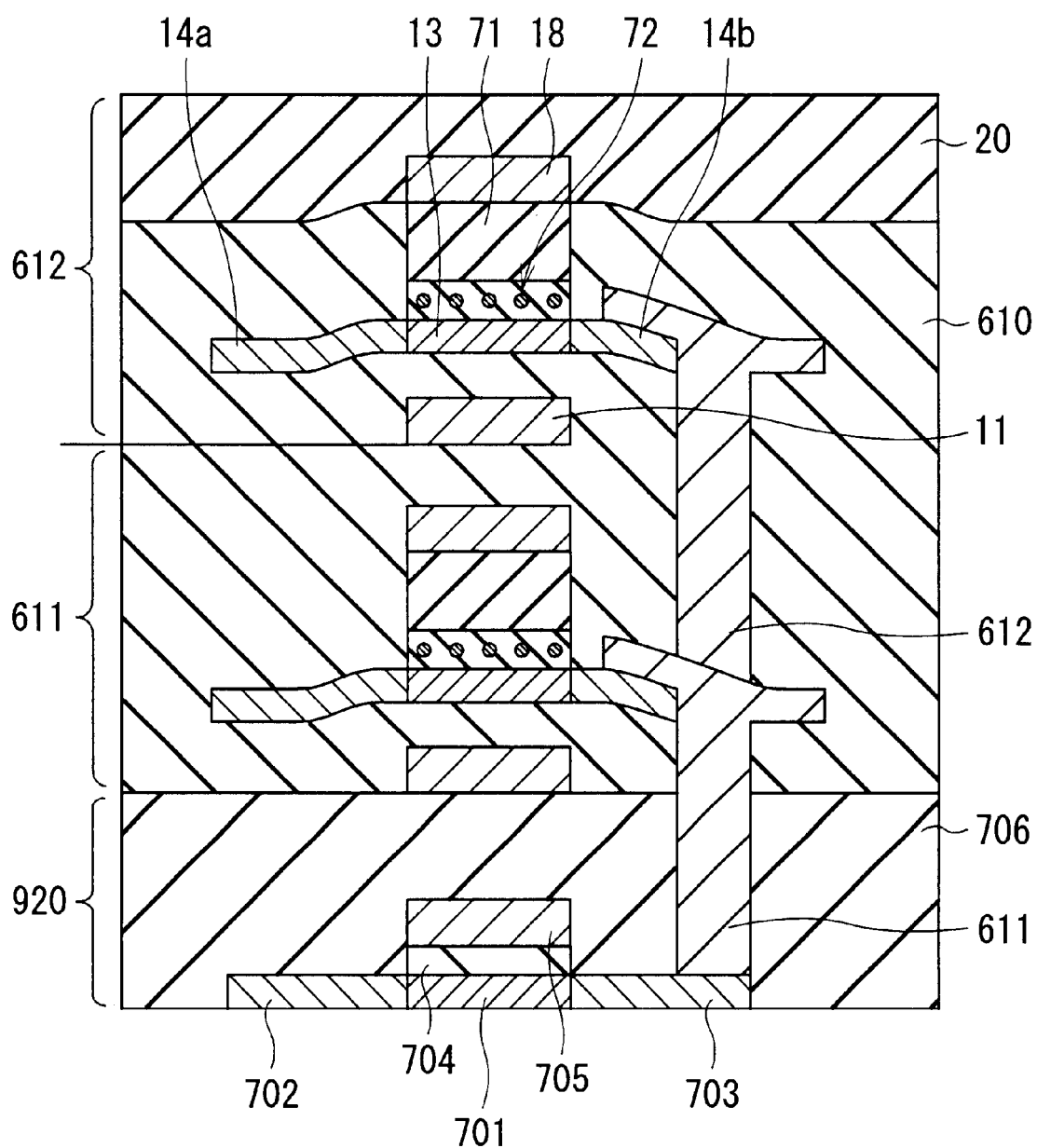
FIG. 36 is a cross sectional view for describing another modification of the integrated circuit according to the twelfth embodiment of the invention.

In the twelfth embodiment, the driving circuit 910 formed of a MOSFET is used to configure the integrated circuit, but the invention is not necessarily limited to this embodiment. For example, as shown in FIG. 36, a driving circuit 920 formed of a thin film transistor may be used to configure the integrated circuit. For instance, the driving circuit 920 comprises a semiconductor layer 701, a source region 702, a drain region 703, a gate insulating film 704, and a gate electrode 705. For example, one end of the interlayer wiring 611 is connected to the drain region 703 of the driving circuit 920. A structure of the integrated circuit shown in FIG. 36, except for the above-mentioned structure, is the same as that of the integrated circuit shown in FIG. 34. The integrated circuit having the above-described configuration can obtain about the same advantages as the integrated circuit of the above-described twelfth embodiment.

Thirteenth Embodiment

Figure 37:
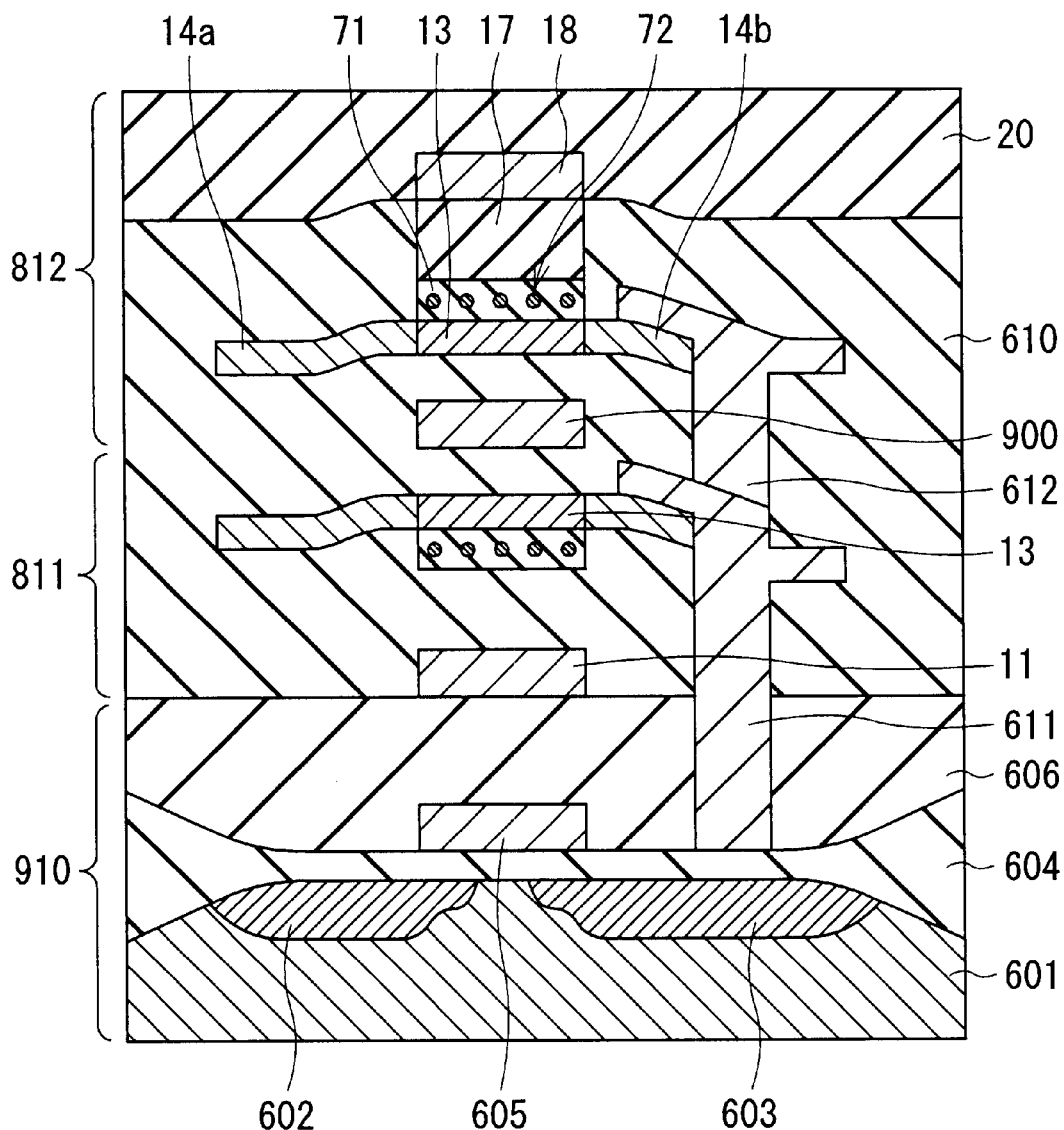
FIG. 37 is a cross sectional view for describing a configuration of an integrated circuit according to a thirteenth embodiment of the invention.

Next, a further example of integration of memory devices will be described with reference to FIG. 37. An integrated circuit according to a thirteenth embodiment comprises memory devices having different structures, e.g., the memory device of the above-described fifth embodiment (see FIG. 14) and the memory device of the modification thereof (see FIG. 18), which are integrated into a hierarchically stacked structure. In FIG. 37, the same components as the components of the above-described fifth and twelfth embodiments are indicated by the same reference numerals, and the detailed description of the same components is appropriately omitted.

FIG. 37 shows a sectional structure of an integrated circuit on which memory devices are integrated. The integrated circuit comprises, for example, two memory devices 811 and 812, which are hierarchically stacked on the insulating film 606. For instance, the first-level memory device 811 has the same structure as the memory device of the modification of the above-described fifth embodiment (see FIG. 18) has, and the memory device 811 has the storage region 72 which is provided between the conduction region 13 and the first control electrode 11. On the other hand, the second-level memory device 812 has the same structure as the memory device of the above-described fifth embodiment (see FIG. 14) has, and the memory device 812 has the storage region 72 which is provided between the conduction region 13 and the second control electrode 18. One electrode (a control electrode 900) is provided between the conduction region 13 of the memory device 811 and the conduction region 13 of the memory device 812. The control electrode 900 functions as "a second control electrode" for the memory device 811 and also functions as "a first control electrode" for the memory device 812. A structure of the integrated circuit shown in FIG. 37, except for the above-mentioned structure, is the same as that of the integrated circuit shown in FIG. 34.

Functions of each of the memory devices of the integrated circuit are substantially the same as those of the memory device of the above-described fifth embodiment. That is, the memory device 811 is driven by applying an electric potential to the control electrode 900 for functioning as "the second control electrode", whereas the memory device 812 is driven by applying an electric potential to the control electrode 900 for functioning as "the first control electrode".

Advantages and the like of the integrated circuit having the above-described configuration are the same as those of the integrated circuit of the above-described twelfth embodiment. As a matter of course, the memory device for use in "integration of memory devices" according to the thirteenth embodiment is not limited to the memory device according to the above-described fifth embodiment, and the memory device according to any one of the other embodiments may be used.

Although the invention has been described above by referring to the embodiments, the invention is not limited to the above-described embodiments and various modifications of the invention are possible. For example, in the above-described first to eighth embodiments, the insulating films 2 and 3 are stacked in sequence on the substrate 1 so as to form the underlayer portion 10, but only either the insulating film 2 (silicon nitride) or the insulating film 3 (silicon dioxide) may be formed on the substrate 1 so as to form the underlayer portion 10. Besides the above-mentioned configuration, for example, an insulating film made of siliconoxynitride may be formed on the substrate 1 so as to form the underlayer portion 10. Any underlayer portion may be used as the underlayer portion 10 so long as it can serve as an underlayer on which the memory transistor and the like are to be formed. For example, an insulating film, which is formed on an optional semiconductor device on an appropriate substrate, may be used as the underlayer portion.

In the above-described embodiments, the conduction region, the first impurity region and the second impurity region are made of polycrystalline silicon or amorphous silicon, but the invention is not necessarily limited to these embodiments, and, for example, the above-mentioned regions may be made of a composite material of polycrystalline silicon and amorphous silicon, or the like. Alternatively, the above-mentioned regions may be made of a material other than silicon, e.g., germanium or the like, or may be made of a compound semiconductor, e.g., silicongermanium, gallium arsenide (GaAs) or the like.

In the above-described embodiments, the tunnel insulating film is made of an oxide film, but the invention is not necessarily limited to these embodiments, and, for example, the tunnel insulating film may be made of a nitride film or an oxynitride film. To form the tunnel insulating film by the nitride film, for example, the surfaces of the conduction region and the like are exposed to an ionized gas containing atoms of nitrogen (N), which is generated by introducing ammonia ($NH_3$) or nitrogen ($N_2$) into an alternating electromagnetic field, whereby the tunnel insulating film made of the nitride film can be formed. To form the tunnel insulating film by the oxynitride film, for example, the surfaces of the conduction region and the like are exposed to an ionized gas containing atoms of oxygen and atoms of nitrogen, which is generated by introducing nitrous oxide ($N_2O$) into an alternating electromagnetic field, whereby the tunnel insulating film made of the oxynitride film can be formed.

In the above-described embodiments, the tunnel insulating film is heated by irradiation with the energy beam so as to reduce structural defects in the tunnel insulating film, but the invention is not necessarily limited to these embodiments. Besides the above-mentioned irradiation with the energy beam, for example, a heating apparatus such as a lamp or a heater may be used as a method of heating the tunnel insulating film. Preferably, the tunnel insulating film is heated within a range of temperatures, which is selected so as to avoid the substrate 1 from deforming.

In the above-described fifth embodiment, the non-stoichiometric film 110 is heated by irradiation with the energy beam, but the invention is not necessarily limited to this embodiment, and, for example, the non-stoichiometric film 110 may be heated by use of the above-mentioned heating apparatus such as the heater.

In the above-described ninth to twelfth embodiments, a plurality of memory devices having the same structure are integrated, but the invention is not necessarily limited to these embodiments. For example, a plurality of memory devices having different structures may be integrated, as in the case of the above-described thirteenth embodiment. In this case, the order in which a plurality of memory devices are arranged or the like can be freely set.

A plurality of memory devices are integrated in parallel in the above-described ninth to eleventh embodiments, or a plurality of memory devices are integrated into the hierarchically stacked structure in the above-described twelfth and thirteenth embodiments. However, the invention is not necessarily limited to these embodiments. For example, a plurality of memory devices may be integrated in parallel and integrated into the hierarchically stacked structure so as to construct the integrated circuit. Also in this case, the same advantages as the advantages of the above-described embodiments can be obtained.

As described above, according to the memory device of the invention or the method of manufacturing a memory device of the invention, the memory device comprises the first control electrode and the second control electrode which are located with the conduction region in between. Therefore, at the time of "the reading of data", an electric potential is applied to the first control electrode, and thus a change in an electric potential between the conduction region and the storage region is prevented, so that the transfer of an electric charge resulting from the change in the electric potential is prevented. Accordingly, unintentional writing or erasing of data is prevented at the time of "the reading of data", so that written data can be accurately read out.

According to the memory device of one aspect of the invention, the storage region includes a plurality of dispersed particles, and therefore the unintentional "erasing of data" due to the leakage of an electric charge is prevented, so that written data can be held with stability for a long time.

According to the memory device of another aspect of the invention, a thickness of the conduction region lies between 0.01 $\mu$m and 0.1 $\mu$m both inclusive, and therefore the high-performance memory device including the conduction region made of non-single-crystal silicon properly crystallized can be configured.

According to the memory device of still another aspect of the invention, one of the first and second control insulating films, which is provided in a region opposite to a region in which the storage region is provided, has less thickness than the other has. Therefore, an electric potential to be applied to one electrode provided in the region opposite to the region in which the storage region is provided can be lower than an electric potential to be applied to the other electrode. Accordingly, power consumption required for driving the memory device can be reduced.

According to the method of manufacturing a memory device of one aspect of the invention, a surface of the conduction region is exposed to an ionized gas containing at least either atoms of oxygen or atoms of nitrogen, whereby the tunnel insulating film is formed. Therefore, the tunnel insulating film can be formed under the temperature conditions that a processing temperature be relatively low. Accordingly, the tunnel insulating film can be easily formed, and moreover, an inexpensive material having relatively low heat resistance can be used as a material of the underlayer portion.

According to the method of manufacturing a memory device of another aspect of the invention, the surface of the conduction region is heated by irradiation with an energy beam after forming the tunnel insulating film, and therefore, structural defects in the tunnel insulating film and on the interface between the tunnel insulating film and the conduction region can be reduced without a rise in the temperature of the underlayer portion. Accordingly, even if the tunnel insulating film is formed under the temperature conditions that the processing temperature be relatively low, the leakage of an electric charge due to the above-mentioned structural defects can be prevented, so that written data can be held with stability for a long time.

According to the integrated circuit of the invention, the memory device of the invention is integrated on the integrated circuit, and therefore, in particular, unintentional writing or erasing of data is prevented at the time of "the reading of data", so that written data can be accurately read out.

According to the integrated circuit of one aspect of the invention, the memory devices are integrated into a hierarchically stacked structure, and therefore the number of memory devices which can be integrated per unit area becomes greater than the number of memory devices which can be integrated in a two-dimensional arrangement of memory devices. It is therefore possible to increase the storage capacity, as well as reduce the area to be occupied by the integrated circuit.

Obviously many modifications and variations of the present invention are possible in the light of the above teachings. It is therefore to be understood that within the scope of the appended claims the invention may be practiced otherwise than as specifically described.

What is claimed is:

1. A memory device comprising:
    an underlayer portion made of an insulator;
    a first control electrode provided on a surface of the underlayer portion;
    a conduction region made of a semiconductor, provided so as to correspond to the first control electrode;
    a second control electrode provided in a region opposite to a region in which the first control electrode is provided, with the conduction region between the first and second control electrodes;
    a first impurity region provided adjacent to the conduction region;
    a second impurity region provided apart from the first impurity region and adjacent to the conduction region;
    a storage region provided in either a region between the first control electrode and the conduction region or a region between the second control electrode and the conduction region, the storage region for storing an electric charge transferring from the conduction region;
    a tunnel insulating film provided in a region between the storage region and the conduction region;
    a first control insulating film provided between the first control electrode and the conduction region; and
    a second control insulating film provided between the second control electrode and the conduction region.

2. A memory device according to claim 1, wherein the underlayer portion includes a substrate made of a predetermined material, and an underlayer insulating film provided so as to coat a surface of the substrate.

3. A memory device according to claim 2, wherein the substrate is made of a material containing silicate glass, silica glass or resin.

4. A memory device according to claim 2, wherein the underlayer insulating film is made of a material containing at least one of silicon nitride and silicon dioxide.

5. A memory device according to claim 1, wherein at least one of the first control electrode and the second control electrode controls the amount of electric charge stored in the storage region and the conductivity of the conduction region.

6. A memory device according to claim 1, wherein both the first control electrode and the second control electrode are made of a material containing metal, polycrystalline silicon or amorphous silicon.

7. A memory device according to claim 1, wherein the storage region includes a plurality of dispersed particles.

8. A memory device according to claim 7, wherein the storage region is made of a material, which contains metal, a semiconductor containing either silicon or germanium, or a material containing silicon nitride.

9. A memory device according to claim 1, wherein the conduction region, the first impurity region and the second impurity region are made of a material containing a non-single-crystal semiconductor.

10. A memory device according to claim 9, wherein the conduction region, the first impurity region and the second impurity region are made of a material containing polycrystalline silicon.

11. A memory device according to claim 9, wherein the conduction region, the first impurity region and the second impurity region are made of a material containing amorphous silicon.

12. A memory device according to claim 9, wherein the conduction region is made of a material containing amorphous silicon, and both the first impurity region and the second impurity region are made of a material containing polycrystalline silicon.

13. A memory device according to claim 1, wherein a thickness of the conduction region lies between $0.01\ \mu m$ and $0.1\ \mu m$ both inclusive.

14. A memory device according to claim 1, wherein the tunnel insulating film, the first control insulating film and the second control insulating film are made of a material containing silicon dioxide, silicon nitride, or a compound of silicon, oxygen and nitrogen.

15. A memory device according to claim 1, wherein one of the first and second control insulating films, which is provided in a region opposite to a region in which the storage region is provided, has less thickness than the other has.

16. A memory device according to claim 1, wherein an electric potential of the first impurity region is equalized with an electric potential of the first control electrode, and a higher electric potential than the electric potential of the first impurity region is applied to at least the second control electrode of the second control electrode and the second impurity region, whereby the amount of electric charge in the storage region is increased, so that the writing of data is performed,
    the respective electric potentials of the first control electrode, the second control electrode, the first impurity region and the second impurity region are made equal or floating, whereby data is held, or
    the electric potential of the first impurity region is equalized with the electric potential of the first control electrode, and a lower electric potential than the electric potential of the first impurity region is applied to at least the second control electrode of the second control electrode and the second impurity region, whereby the amount of electric charge in the storage region is reduced, so that the erasing of data is performed.

17. A memory device according to claim 16, wherein a positive electric potential is applied to the second control electrode, a positive electric potential lower than the electric potential of the second control electrode is applied to the first control electrode, and the conductivity of the conduction region for the electric potential of either the first control electrode or the second control electrode or the amount of electric current passing through the conduction region is measured, whereby the amount of electric charge in the storage region is detected, so that the reading of data is performed.

18. A memory device according to claim 1, wherein an electric potential of the first impurity region is equalized with an electric potential of the first control electrode, and a lower electric potential than the electric potential of the first impurity region is applied to at least the second control electrode of the second control electrode and the second impurity region, whereby the amount of electric charge in the storage region is increased, so that the writing of data is performed, the respective electric potentials of the first control electrode, the second control electrode, the first impurity region and the second impurity region are made equal or floating, whereby data is held, or the electric potential of the first impurity region is equalized with the electric potential of the first control electrode, and a higher electric potential than the electric potential of the first impurity region is applied to at least the second control electrode of the second control electrode and the second impurity region, whereby the amount of electric charge in the storage region is reduced, so that the erasing of data is performed.

19. A memory device according to claim 18, wherein a negative electric potential is applied to the second control electrode, a negative electric potential higher than the electric potential of the second control electrode is applied to the first control electrode, and the conductivity of the conduction region for the electric potential of either the first control electrode or the second control electrode or the amount of electric current passing through the conduction region is measured, whereby the amount of electric charge in the storage region is detected, so that the reading of data is performed.

20. An integrated circuit on which a plurality of memory devices are integrated, wherein each of the memory devices has an underlayer portion made of an insulator; a first control electrode provided on a surface of the underlayer portion; a conduction region made of a semiconductor, provided so as to correspond to the first control electrode; a second control electrode provided in a region opposite to a region in which the first control electrode is provided, with the conduction region between the first and second control electrodes; a first impurity region provided adjacent to the conduction region; a second impurity region provided apart from the first impurity region and adjacent to the conduction region; a storage region provided in either a region between the first control electrode and the conduction region or a region between the second control electrode and the conduction region, the storage region for storing an electric charge transferring from the conduction region; a tunnel insulating film provided in a region between the storage region and the conduction region; a first control insulating film provided between the first control electrode and the conduction region; and a second control insulating film provided between the second control electrode and the conduction region.

21. An integrated circuit according to claim 20, wherein the plurality of memory devices are integrated into a hierarchically stacked structure.

* * * * *